(12) United States Patent
Ko et al.

(10) Patent No.: US 11,573,006 B2
(45) Date of Patent: Feb. 7, 2023

(54) LIGHT EMITTING DEVICE AND A LIGHT SOURCE MODULE INCLUDING THE SAME

(71) Applicant: SAMSUNG ELECTRONICS CO., LTD., Suwon-si (KR)

(72) Inventors: Geun-woo Ko, Yongin-si (KR); Seung-woo Lee, Hwaseong-si (KR); Jun-ho Lee, Seoul (KR); Pun-jae Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/721,632

(22) Filed: Apr. 15, 2022

(65) Prior Publication Data
US 2022/0243906 A1 Aug. 4, 2022

Related U.S. Application Data

(63) Continuation of application No. 16/504,983, filed on Jul. 8, 2019, now Pat. No. 11,306,908.

(30) Foreign Application Priority Data

Jul. 9, 2018 (KR) .................. 10-2018-0079576

(51) Int. Cl.
| | |
|---|---|
| F21V 23/00 | (2015.01) |
| F21Y 115/10 | (2016.01) |
| F21V 23/04 | (2006.01) |
| F21K 9/27 | (2016.01) |
| F21K 9/233 | (2016.01) |

(52) U.S. Cl.
CPC ............ *F21V 23/005* (2013.01); *F21K 9/233* (2016.08); *F21K 9/27* (2016.08); *F21V 23/0435* (2013.01); *F21Y 2115/10* (2016.08)

(58) Field of Classification Search
CPC .... F21V 23/005; F21V 23/0435; F21K 9/233; F21K 9/27; F21Y 2115/10
See application file for complete search history.

(56) References Cited

U.S. PATENT DOCUMENTS

| | | | |
|---|---|---|---|
| 6,372,608 | B1 | 4/2002 | Shimoda et al. |
| 6,645,830 | B2 | 11/2003 | Shimoda et al. |

(Continued)

FOREIGN PATENT DOCUMENTS

| | | |
|---|---|---|
| CN | 104637932 | 5/2015 |
| KR | 10-2007-0063977 | 6/2007 |

(Continued)

OTHER PUBLICATIONS

Korean Office Action issued in corresponding KR Patent Application No. 10-2018-0079576 dated Oct. 12, 2022.

*Primary Examiner* — Anne M Hines
(74) *Attorney, Agent, or Firm* — F. Chau & Associates, LLC

(57) ABSTRACT

A light source module including: a printed circuit board; a light emitting device mounted on the printed circuit board and including a plurality of subarrays each of the plurality of subarrays including a plurality of light emitting cells; and a plurality of driving chips mounted on the printed circuit board, wherein each of the plurality of driving chips respectively drives a corresponding one of the plurality of subarrays, wherein the plurality of subarrays are electrically isolated from each other.

20 Claims, 27 Drawing Sheets

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,242,927 B2 | 8/2012 | Reis, II |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,455,892 B2 | 6/2013 | Fukui |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,276,038 B2 | 3/2016 | Lee et al. |
| 10,672,749 B2 | 6/2020 | Goldbach et al. |
| 2012/0280632 A1 | 11/2012 | Kim et al. |
| 2017/0055323 A1 | 2/2017 | Lim et al. |
| 2017/0280527 A1 | 9/2017 | Lee |
| 2017/0325300 A1 | 11/2017 | Drake et al. |
| 2017/0367158 A1 * | 12/2017 | Petersen ............... H05K 1/189 |
| 2020/0011518 A1 | 1/2020 | Ko et al. |

FOREIGN PATENT DOCUMENTS

| | | |
|---|---|---|
| KR | 10-0769106 | 10/2007 |
| KR | 10-1122166 | 2/2012 |
| KR | 10-1201294 | 11/2012 |
| KR | 10-1310741 | 9/2013 |
| KR | 10-1344447 | 12/2013 |
| KR | 10-1372861 | 3/2014 |
| KR | 10-2014-0112180 | 9/2014 |
| KR | 10-2018-0008617 | 1/2018 |

* cited by examiner

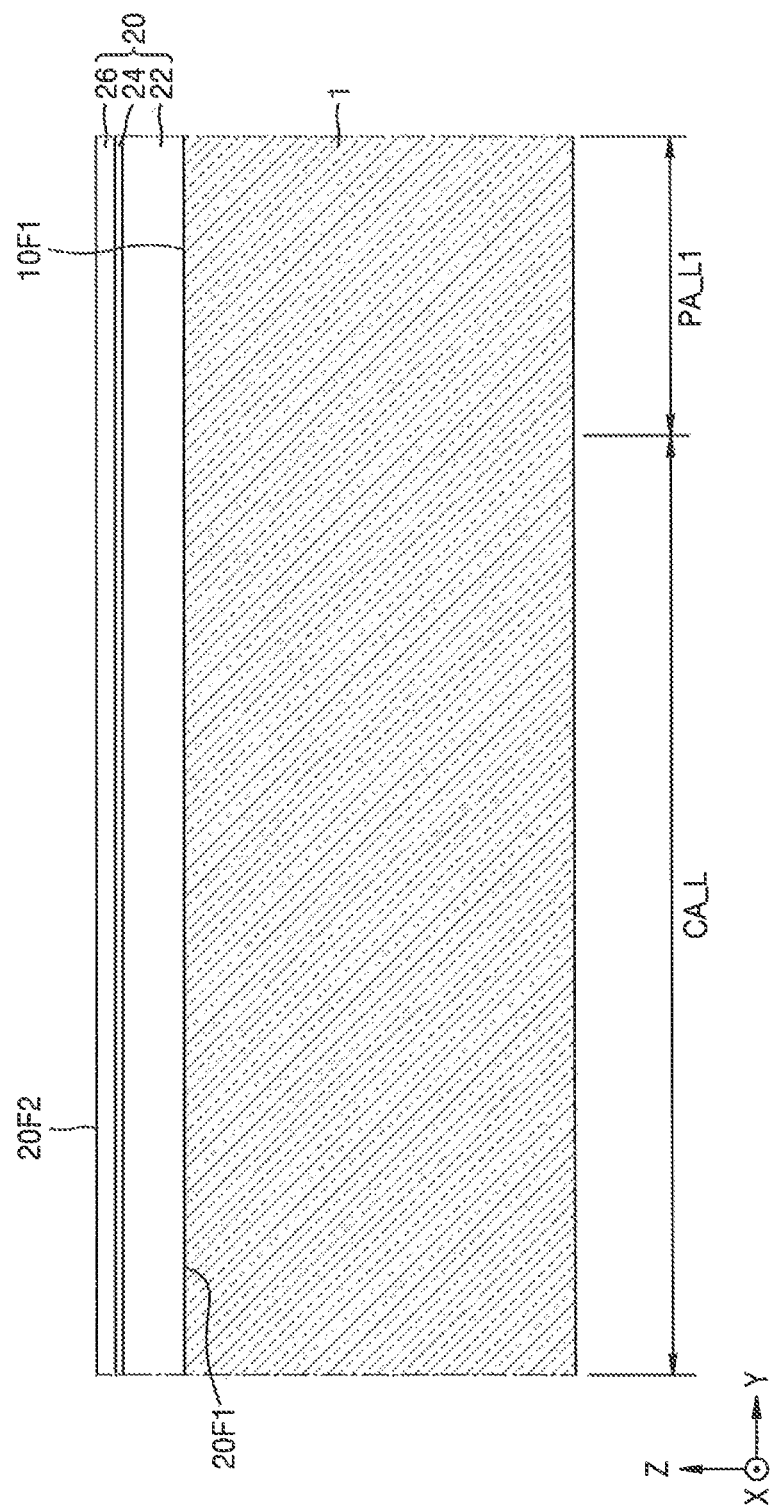

LIGHT EMITTING DEVICE AND A LIGHT SOURCE MODULE INCLUDING THE SAME

CROSS-REFERENCE TO RELATED APPLICATIONS

This application is a continuation of U.S. patent application Ser. No. 16/504,983 filed on Jul. 8, 2019, which claims priority under 35 U.S.C. § 119 to Korean Patent Application No. 10-2018-0079576, filed on Jul. 9, 2018, in the Korean Intellectual Property Office, the disclosures of which are incorporated by reference herein in their entireties.

TECHNICAL FIELD

The inventive concept relates to a light emitting device and a light source module including the same.

DISCUSSION OF RELATED ART

Semiconductor light emitting devices include devices such as light emitting diodes (LEDs). LEDs have various advantages such as low power consumption, high brightness, and long life. As a consequence, their application area is expanding to include light sources such as lamps. In particular, semiconductor light emitting devices have been used to replace conventional halogen or xenon lamps as light sources m automobile head lamps or tail lamps.

When a semiconductor light emitting device is used for lighting, it may be necessary to adjust its brightness, light orientation angle, or irradiation angle. For example, in the case of automobile head lamps or tail lamps, the brightness of light may be adjusted depending on an external environment.

SUMMARY

According to an exemplary embodiment of the inventive concept, there is provided a light source module including: a printed circuit board; as light emitting device mounted on the printed circuit hoard and comprising a plurality of subarrays each of the plurality of subarrays comprising a plurality of light emitting cells; and a plurality of driving chips mounted on the printed circuit hoard, wherein each of the plurality of driving chips respectively drives a corresponding one of the plurality of subarrays, wherein the plurality of subarrays are electrically isolated from each other.

According to an exemplary embodiment of the inventive concept, there is provided a light emitting device including: a plurality of subarrays each comprising a plurality of light emitting cells; and a plurality of pads for providing an electrical connection between an external device and the plurality of subarrays, wherein the plurality of subarrays are electrically isolated from each other.

According to an exemplary embodiment of the inventive concept, there is provided a light source module including: a printed circuit board; a light emitting device mounted on the printed circuit board and comprising a first subarray and a second subway, wherein the first subarray and the second subarray each comprise a plurality of light emitting cells; a first driving chip mounted on the printed circuit board to drive the first subarray; and a second driving chip mounted on the printed circuit board to drive the second subarray, wherein the first subarray and the second subarray are electrically isolated from each other, the first subarray and the second subarray are arranged sequentially in a first direction parallel to a first surface of the printed circuit board, and the first driving chip and the second driving chip are arranged sequentially in the first direction.

BRIEF DESCRIPTION OF THE DRAWINGS

The above and other features of the inventive concept will be more clearly understood by describing in detail exemplary embodiments thereof with reference to the accompanying drawings in which:

FIGS. 9A, 9B, 9C, 9D, 9E 9F, 9G, 9H, 9I, 9J, 91K and 9L are sequential cross-sectional views illustrating a method of manufacturing a light emitting device according to an exemplary embodiment of the inventive concept;

DETAILED DESCRIPTION OF THE EMBODIMENTS

Figure 1:
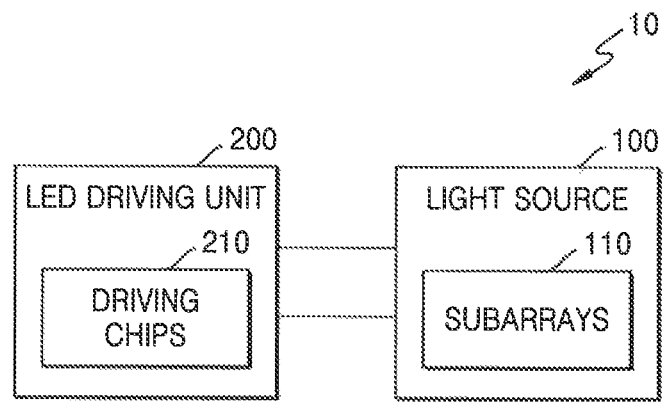
FIG. 1 is a block diagram illustrating a light source module according to an exemplary embodiment of the inventive concept.

Hereinafter, exemplary embodiments of the inventive concept will be described in detail with reference to the accompanying drawings. In the drawings, like reference numerals may refer to like elements.

FIG. 1 is a block diagram illustrating a light source module according to an exemplary embodiment of the inventive concept.

Referring to FIG. 1, a light source module 10 may include a light source 100 and a light emitting diode (LED) driving unit 200.

The light source 100 may include an LED array including a plurality of light emitting cells. In an exemplary embodiment of the inventive concept, the LED array constituting the light source 100 may include a plurality of subarrays 110, The light emitting cells included in different subarrays may be electrically isolated from each other.

The LED driving unit 200 may be connected to a power supply unit. The power supply unit may generate an input voltage to operate the light source 100 and provide the input voltage to the light source 100. In an exemplary embodiment of the inventive concept, when the light source module 10 is a head lamp for an automobile, the power supply unit may be a battery mounted in the automobile. In an exemplary embodiment of the inventive concept, when the light source module 10 is a home or business illuminator, the light source module 10 may further include an alternating current (NC) power supply for generating an AC voltage as well as a voltage regulator circuit and a rectifier circuit for generating a direct current (DC) voltage by rectifying the AC voltage.

The LED driving unit 200 may include a plurality of driving chips 210. Each of the plurality of driving chips 210 may be an integrated circuit (IC).

The plurality of driving chips 210 may drive the LED array included in the light source 100, In an exemplary embodiment of the inventive concept, each of the plurality of driving chips 210 may be electrically connected to a corresponding subarray among the plurality of subarrays 110 and may controllably operate the light emitting cells included in the corresponding subarray. In an exemplary embodiment of the inventive concept, the number of the plurality of driving chips 210 may be equal to the number of the plurality (if subarrays 110 included in the light source 100. However, the inventive concept is not limited thereto and the number of the plurality of driving chips 210 and the number of the plurality of subarrays 11 may be different from each other.

Figure 2:
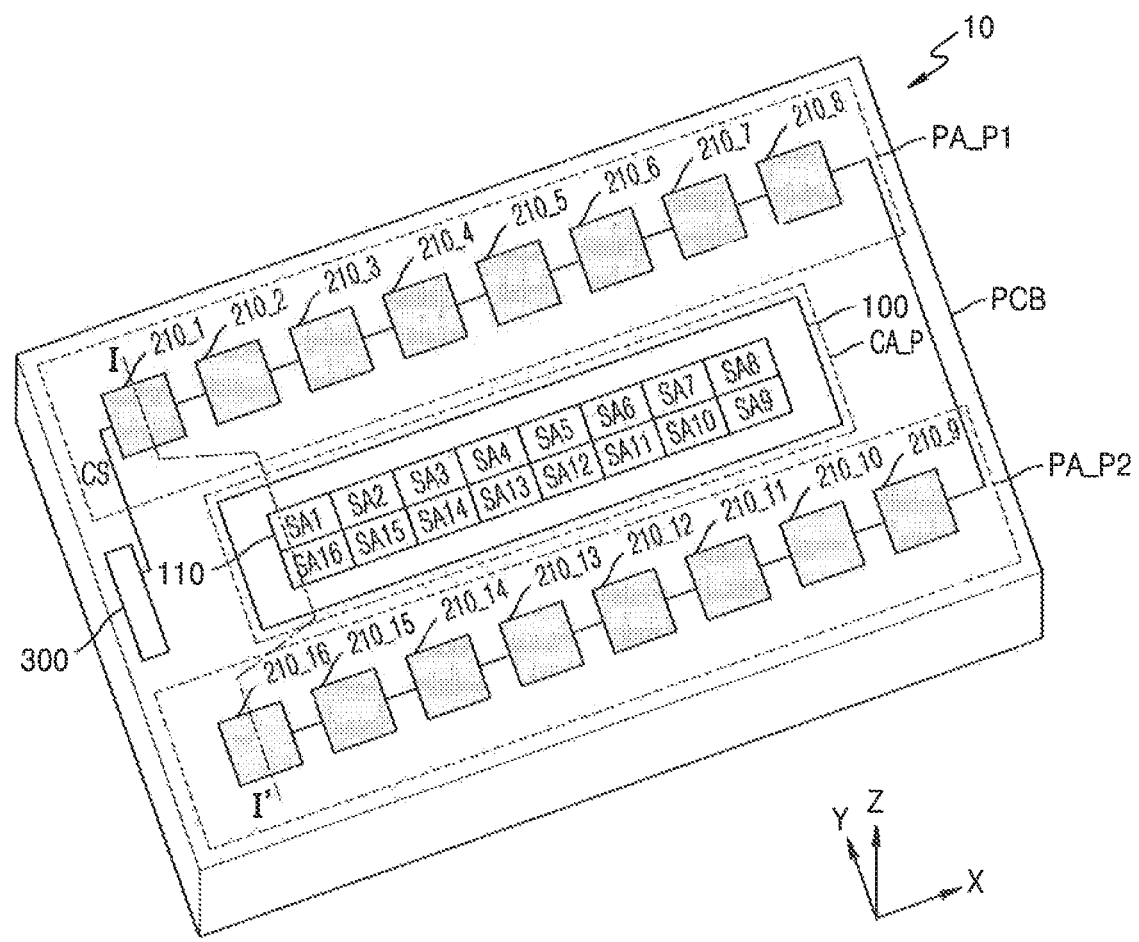
FIG. 2 is a perspective view illustrating a light source module according to an exemplary embodiment of the inventive concept.
Figure 3:
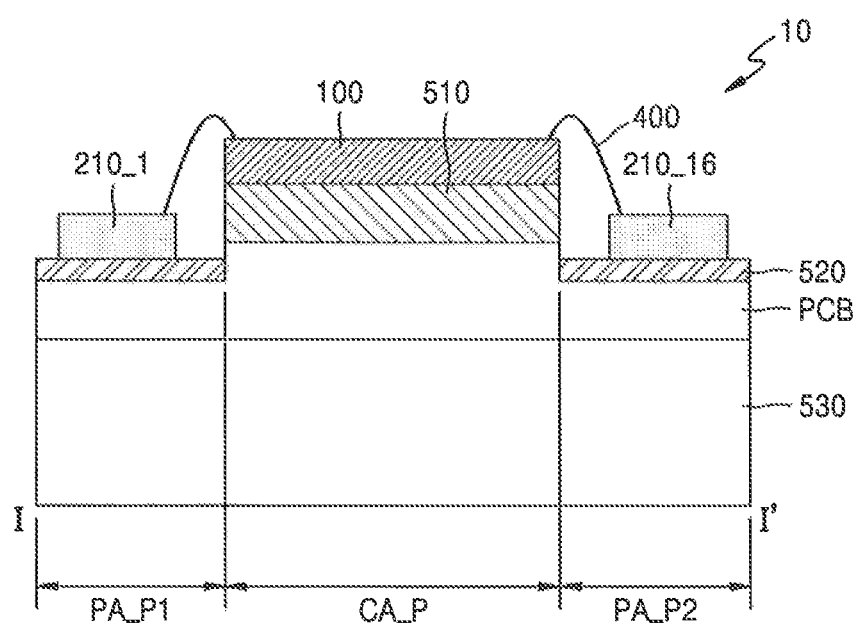
FIG. 3 is a cross-sectional view taken along line I-I' of FIG. 2.

FIG. 2 is a perspective view illustrating a light source module according to an exemplary embodiment of the inventive concept. FIG. 3 is a cross-sectional view taken along line I-I' of FIG. 2, A light emitting device 100 of FIG. 2 may correspond to the light source 100 of FIG. 1.

Referring to FIG. 2, a light source module 10 may include a light emitting device 100 and a plurality of driving chips 210_1, 210_2, 210_3, 210_4, 210_5, 210_6, 210_7, 210_8, 210_9, 210_10, 210_11, 210_12, 210_13, 210_14, 210_15 and 210_16 mounted on a substrate printed circuit board (PCB), In an exemplary embodiment of the inventive concept, the light emitting device 100 may be one chip, and the light source module 10 may include the light emitting device 100 constructed as one chip.

The light emitting device 100 may include an LED array in which a plurality of light emitting cells are arranged. The LED array may be divided into a plurality of subarrays SA1, SA2, SA3, SA4, SA5, SA6, SA7, SA5, SA9, SA10, SA11, SA12, SA13, SA14, SA15 and SA16. Although 16 subarrays SA1 to SA16 are illustrated in Ha 2, the light source module 10 according to an exemplary embodiment of the inventive concept is not limited thereto. For example, the number of subarrays may vary, and the arrangement of the subarrays SA1 to SA16 may also vary.

The plurality of subarrays SA1 to SA16, which may also be identified by reference numeral 110, may be electrically isolated from each other. In other words, the light emitting cells included in different subarrays may be electrically insulated from each other.

The light emitting device 100 may have a rectangular shape that is shorter in a second direction Y than in a first direction X. The first direction X and the second direction Y may be parallel to a main surface of the substrate PCB and perpendicular to each other. In an exemplary embodiment of the inventive concept the plurality of subarrays SA1 to SA16 may be arranged in two rows in the light emitting device 100. For example, the first to eighth subarrays SA1 to SA8 may be arranged sequentially in the bust direction X, and the ninth to sixteenth subarrays SA9 to SA16 may be arranged sequentially in the opposite direction (−X) of the first direction X. The sixteenth subarray SA16 and the first subway SA1 may be arranged in parallel in the second direction Y. Since the plurality of subarrays SA1 to SA16 are arranged in two rows, it may be structurally easy to form a plurality of pads for connecting the light emitting device 100 to the plurality of driving chips 210_1 to 210_16, The arrangement of the plurality of pads will be described below with reference to FIG. 4.

Each of the plurality of driving chips 210_1 to 210_16 may controllably operate the light emitting cells included in its corresponding subarray. For example, the first driving chip 2101 may be electrically connected to the first subarray SA1 and may control the operation of the first subarray SA1. The second driving chip 210_2 may be electrically connected to the second subarray SA2 and may control the operation of the second subarray SA2. The description of the first driving chip 210_1 and the second driving chip 210_2 may also be similarly applied to the third to sixteenth driving chips 210_3 to 210_16. For example, the fifteenth driving chip 210_15 may be electrically connected to the fifteenth subarray SA15 and may control the operation of the fifteenth subarray SA15, and the sixteenth driving chip 210_16 may be electrically connected to the sixteenth subarray SA16 and may control the operation of the sixteenth subarray SA16.

The light source module 10 may further include an input unit 300 for receiving signals used to operate the light source module 10 from the outside. The plurality of driving chips 210_1 to 210_16 may receive a control signal CS from the input unit 300, and the operation of the plurality of driving chips 210_1 to 210_16 may be controlled based on the control signal CS. For example, when the input unit 300 outputs the control signal. CS to cause only the fourth, fifth, twelfth, and thirteenth subarrays SA4, SA5, SA12, and SA13 to emit light, the fourth, fifth, twelfth, and thirteenth driving chips 210_4, 210_5, 210_12, and 210_13 may respectively apply a voltage to the fourth, fifth, twelfth, and thirteenth subarrays SA4, SA5, SA12, and SA13. In addition, the plurality of driving chips 210_1 to 210_16 may receive driving power from the input unit 300.

At least some of the plurality of driving chips 210_1 to 21016 may be arranged to correspond to a particular subarray. For example, in the light emitting device 100, the first to eighth subarrays SA1 to SA8 are arranged sequentially in the first direction X, and the first to eighth driving chips 2101 to 210_8 corresponding to the first to eighth subarrays SA1 to SA8 may also be arranged sequentially in the first direction X. In addition, in the light emitting device 100, the ninth to sixteenth subarrays SA9 to SA16 are arranged sequentially in the opposite direction (−X) of the first direction X. and the ninth to sixteenth driving chips 210_9 to 210_16 corresponding to the ninth to sixteenth subarrays SA9 to SA10 may also be arranged sequentially in the opposite direction (−X) of the first direction X, However, the arrangement of the plurality of driving chips 210_1 to 210_16 is not limited thereto. For example, just some of the first to eighth driving chips 210_1 to 210_8 may be arranged sequentially in the first direction X. Nevertheless, since the arrangement order of the plurality of driving chips 210_1 to 210_16 and the arrangement order of the plurality of subarrays SA1 to SA16 correspond to each other, it may be easy to form lines or wires for electrically connecting the plurality of driving chips 210_1 to 210_16 to the plurality of subarrays SA1 to SA16.

In an exemplary embodiment, of the inventive concept, the number of the plurality of driving chips 210_1 to 210_16 may be equal to the number of the plurality of subarrays SA1 to SA16. However, the light source module 10 according to an exemplary embodiment of the inventive concept is not limited thereto. For example, different driving chips may be connected to one subarray and control that subarray, or one driving chip may control different subarrays.

In an exemplary embodiment of the inventive concept, the plurality of driving chips 210_1 to 210_16 may be electrically connected in series. For example, the first driving chip 210_1 may be electrically connected to the second driving chip 210_2, the second driving chip 210_2 may be electrically connected to the first driving chip 210_1 and the third driving, chip 210:3, and the third driving chip 210_3 may be electrically connected to the second driving chip 2102 and the fourth driving chip 210_4. The first driving chip 210_1 may receive the control signal CS from the input unit 300 and transmit the received control signal CS to the second driving chip 210_2, and the second driving chip 210_2 may receive the control signal CS from the first driving chip 210_1 and transmit the received control signal CS to the third driving chip 2103. The description of the first driving chip 2101 and the second driving chip 210_2 may also be similarly applied to the third to sixteenth driving chips 210_3 to 210_16. For example, the ninth driving chip 210_9 may receive the control signal CS from the eighth driving chip 210_8 and transmit the received control signal CS to the tenth driving chip 210_10.

The light emitting device 100 may be mounted on a central region CA_P of the substrate PCB, and the plurality of driving chips 210_1 to 210_16 may be arranged in first and second peripheral regions PA_P1 and PA_P2 of the substrate PCB to surround the light emitting device 100. For example, the first to eighth driving chips 210_1 to 210_8 may be arranged in the first peripheral region PA_P1, and the ninth to sixteenth driving chips 210_9 to 210_16 may be arranged in the second peripheral region PA_P2. Since the plurality of driving chips 210_1 to 210_16 are arranged in the first and second peripheral regions PA_P1 and PA_P2 of the substrate PCB, it may be easy to form lines or wires for electrically connecting the plurality of driving chips 210_1 to 210_16 to the plurality of subarrays SA1 to SA16.

In an exemplary embodiment of the inventive concept, the second peripheral region PA_P2, the central region CA_P, and the first peripheral region PA_P1 may be arranged sequentially in the second direction Y. In an exemplary embodiment of the inventive concept, the light emitting device 100 and the plurality of driving chips 210_1 to 210_16 may overlap each other in a direction parallel to the main surface of the substrate PCB (e.g., in the first direction X or the second direction Y).

In the light source module 10 according to an exemplary embodiment of the inventive concept, one light emitting device 100 including the plurality of light emitting cells for emitting light may be arranged in the central region CA_P of the light source module 10, and the plurality of driving chips 210_1 to 210_16 for driving the light emitting device 100 may be separately arranged in the first and second peripheral regions PA_P1 and PA_P2, Since the light emitting device 100 including the plurality of light emitting cells and the plurality of driving chips 210_1 to 210_16 arc separate chips, the design of the plurality of driving chips 210_1 to 21016 may not be influenced by the structure of the plurality of light emitting cells. Therefore, the design efficiency of the plurality of driving chips 210_1 to 210_16 may be increased.

In addition, since the light emitting device 100 is one LED chip and arranged in the central region CA_P of the light source module 10, the light emitted by the light source module 10 may be concentrated at the central region (TA_P. Since the emitted light is concentrated at the central region CA_P, the number of separate components (e.g., lenses) for concentrating the emitted light may be reduced. For example, the light source module 10 according to an exemplary embodiment of the inventive concept may not include a lens. Since the amount of light lost due to lenses increases as the number of lenses included in the light source module 10 increases, the light emission efficiency of the light source module 10 according to an exemplary embodiment of the inventive concept may be increased.

Referring to FIGS. 2 and 3, the light emitting device 100 and the plurality of driving chips 210 may be mounted on a substrate, for example, a PCB. In an exemplary embodiment of the inventive concept, the substrate PCB may be formed of a metal and a metal compound. For example, the substrate PCB may include a metal-core printed circuit board (MCPCB) and may include, for example, copper (Cu).

In an exemplary embodiment of the inventive concept, the substrate PCB may include a flexible printed circuit board (FPCB) that flexes freely, and is easily modified in various shapes. In addition, the substrate PCB may include a general FR4-type printed circuit board, and may be formed of a resin material containing epoxy, triazine, silicon, polyimide, or the like or may be formed of a ceramic material such as silicon nitride, AlN, or $Al_2O_3$.

A heat dissipating member 530 may be arranged under the substrate PCB (in the −Z direction). Functioning like a heat sink, while supporting the substrate PCB, the heat dissipating member 530 may dissipate the heat generated in the light emitting device 100 to the outside. The heat dissipating member 530 may be formed of a material having high thermal conductivity to increase heat dissipation efficiency, and may be formed of, for example, a metal material but is not limited thereto.

The heat dissipating member 530 may have various shapes. For example, the heat emission efficiency thereof may be increased by including a plurality of protrusions protruding under the substrate PCB (in the −Z direction); however, the inventive concept is not limited thereto.

An interposer 510 may be arranged on a region of the substrate PCB, for example, the central region CA_P, and the light emitting device 100 may be mounted on the interposer 510. Due to the interposer 510, the plurality of pads for electrically connecting the light emitting device 100 to the plurality of driving chips 210_1 to 210_16 may be formed in the peripheral regions surrounding the plurality of subarrays SA1 SA16, The interposer 510 may provide an electrical connection between at least some of the plurality of light emitting cells included in the plurality of subarrays SA1 to SA16 and at least some of the plurality of pads. The peripheral region in which the pads are formed will be described below with reference to FIG. 4.

In an exemplary embodiment of the inventive concept, the substrate PCB ma include an MCPCB, In this case, an insulating layer may not be formed on the substrate PCB in a region where the interposer 510 and the light emitting device 100 are mounted, but rather an interposer bonding layer including a plating layer may be formed thereon. Since the interposer 510 and the light emitting device 100 are mounted on the interposer bonding layer by eutectic bonding or soldering, the thermal resistance thereof' may be reduced and thus the heat generated in the light emitting device 100 may be easily dissipated to the outside.

An insulating layer 520 may be stacked on another region of the substrate PCB, for example, the first and second peripheral regions PA_P1 and PA_P2, and the plurality of driving chips 210_1 to 210_16 may be mounted on the insulating layer 520. In an exemplary embodiment of the inventive concept, the insulating layer 520 on which the plurality of driving chips 210_1 to 210_16 are mounted may be formed to a thickness of about 1 µm to about 30 µm on the substrate PCB; however, the inventive concept is not limited thereto.

Pads connecting the light emitting device 100 to the plurality of driving chips 2101 to 210_16 may be formed on a light emitting surface (e.g., a surface formed in a third direction Z) where the light emitting device 100 emits light. The plurality of driving chips 210_1 to 210_16 may be electrically connected to the light emitting device 100 respectively through bonding wires 400 connected to the pads.

However, the light source module 10 according to an exemplary embodiment of the inventive concept is not limited thereto, and some electrodes of the light emitting cells included in the light emitting device 100 may be formed on an opposite surface of the light emitting surface (e.g., a surface formed in the opposite direction (–Z) of the third direction Z). Accordingly, at least one pad among the plurality of pads connecting the plurality of driving chips 210_1 to 210_16 to the electrodes of the light emitting cells included in the light emitting, device 100 may be formed under the interposer 510 to electrically connect the substrate PCB to the interposer 510. In this case, an insulating layer may be interposed between the substrate PCB and the interposer 510, and the pad under the interposer 510 may be arranged in a region where the insulating layer is partially removed to expose the substrate PCB, to function as an attachment pad for attaching the substrate PCB to the interposer 510.

Figure 4:
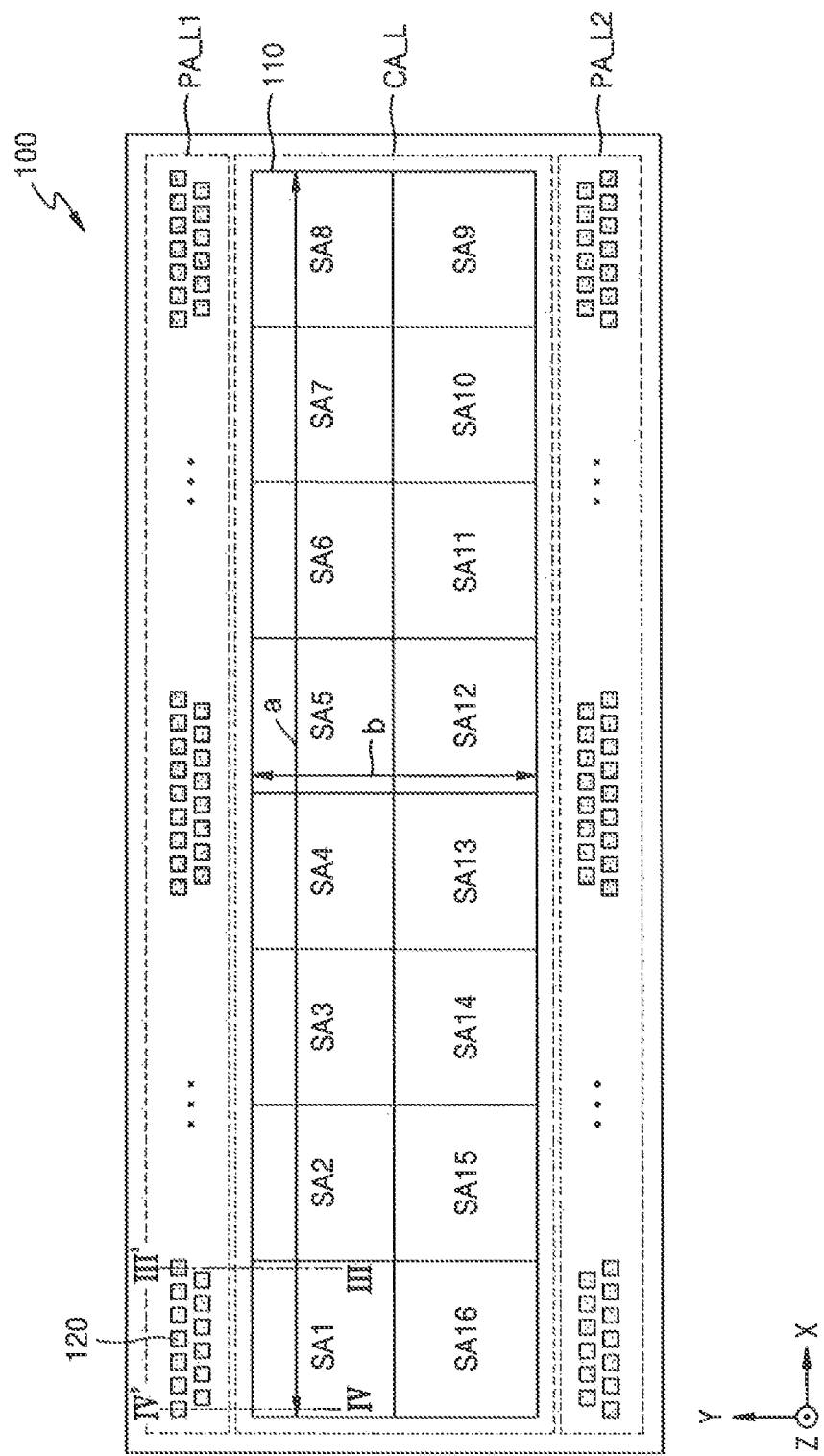
FIG. 4 is a plan view illustrating a light emitting device according to an exemplary embodiment of the inventive concept.

FIG. 4 is a plan view illustrating a light emitting device according to an exemplary embodiment of the inventive concept.

Referring to FIG. 4, a light emitting device 100 may include a light emitting cell region in which a plurality of light emitting cells are formed, and first and second pad regions PA_L1 and PA_L2 in which a plurality of pads 120 are formed. The light emitting cell region CA_L may be arranged in a central region of the light emitting device 100, and the first and second pad regions PA_L1 and PA_L2 may be arranged in an outer region surrounding the central region. For example, the second pad region PA the light emitting cell region CA_L, and the first pad region PA_L1 may be arranged sequentially in the second direction Y.

The plurality of light emitting cells may be divided into a plurality of subarrays SA1 to SA16. Although a total of 16 subarrays SA1 to SA16 are illustrated in FIG. 4, the light emitting device 100 according to an exemplary embodiment of the inventive concept is not limited thereto. For example, the number of subways may vary, and the arrangement of the subarrays SA1 to SA16 may also vary. In this case, the plurality of subarrays SA1 to SA16 may be electrically isolated from each other.

In an exemplary embodiment of the inventive concept, the plurality of subarrays SA1 to SA16 may be arranged in a rectangular shape such that a length "a" in the first direction X is longer than a length "b" in the second direction Y. For example, the plurality of subarrays SA1 to SA16 may be arranged in a total of two rows including a first row and a second row. The first to eighth subarrays SA1 to SA8 may be arranged sequentially in the first row in the first direction X, and the ninth to sixteenth subarrays SA9 to SA16 may be arranged sequentially in the second row in the opposite direction (–X) of the first direction X. Although FIG. 4 illustrates that two subarrays are arranged in the second direction Y, the inventive concept is not limited thereto and three or more subarrays may be arranged in the second direction Y.

The first to eighth subarrays SA1 to SA8 arranged in the first row may be electrically connected to driving chips (e.g., 210_1 to 210_8 in FIG. 2) through the plurality of pads 120 arranged in the first pad region PA_L1 The ninth to sixteenth subarrays SA9 to SA16 arranged in the second row may be electrically connected to driving chips (e.g., 210_9 to 210_16 in FIG. 2) through the plurality of pads 120 arranged in the second pad region PA_L2.

In the light emitting device 100 according to an exemplary embodiment of the inventive concept, the first and second pad regions PA_L1 and PA_L2 may be arranged in parallel in the second direction Y. The first and second pad regions PA_L1 and PA_L2 may not be arranged on the light emitting cell region CA_L including the plurality of light emitting cells. In other words, the first and second pad regions PA_L1 and PA_L2 where the plurality of pads 120 are arranged and the light emitting cell region CA_L may not to overlap each other in the third direction Z perpendicular to the main surface of the substrate. Since the light emitting device 100 includes the first and second pad regions PA_L1 and PA_L2 separately from the light emitting cell region the density of the plurality of light emitting cells in the light emitting cell region CA_L may be increased. In addition, since the plurality of pads 120 are arranged in the outer region of the light emitting device 100, it may be easy to form a structure for connecting the driving chips (e.g., 210_1 to 21016 in FIG. 2) to the plurality of pads 120 (e.g., via the bonding wires 400 of FIG. 3).

In exemplary embodiments of the inventive concept, in a plan view, the light emitting cell region CA_L may have an area corresponding to the 50% to about 90% of the total area of the light emitting device 100, and the first and second pad regions PA_L1 and PA_L2 may have an area corresponding to about 10% to about 50% of the total area of the light emitting device 100; however, the inventive concept is not limited thereto.

Figure 5A:
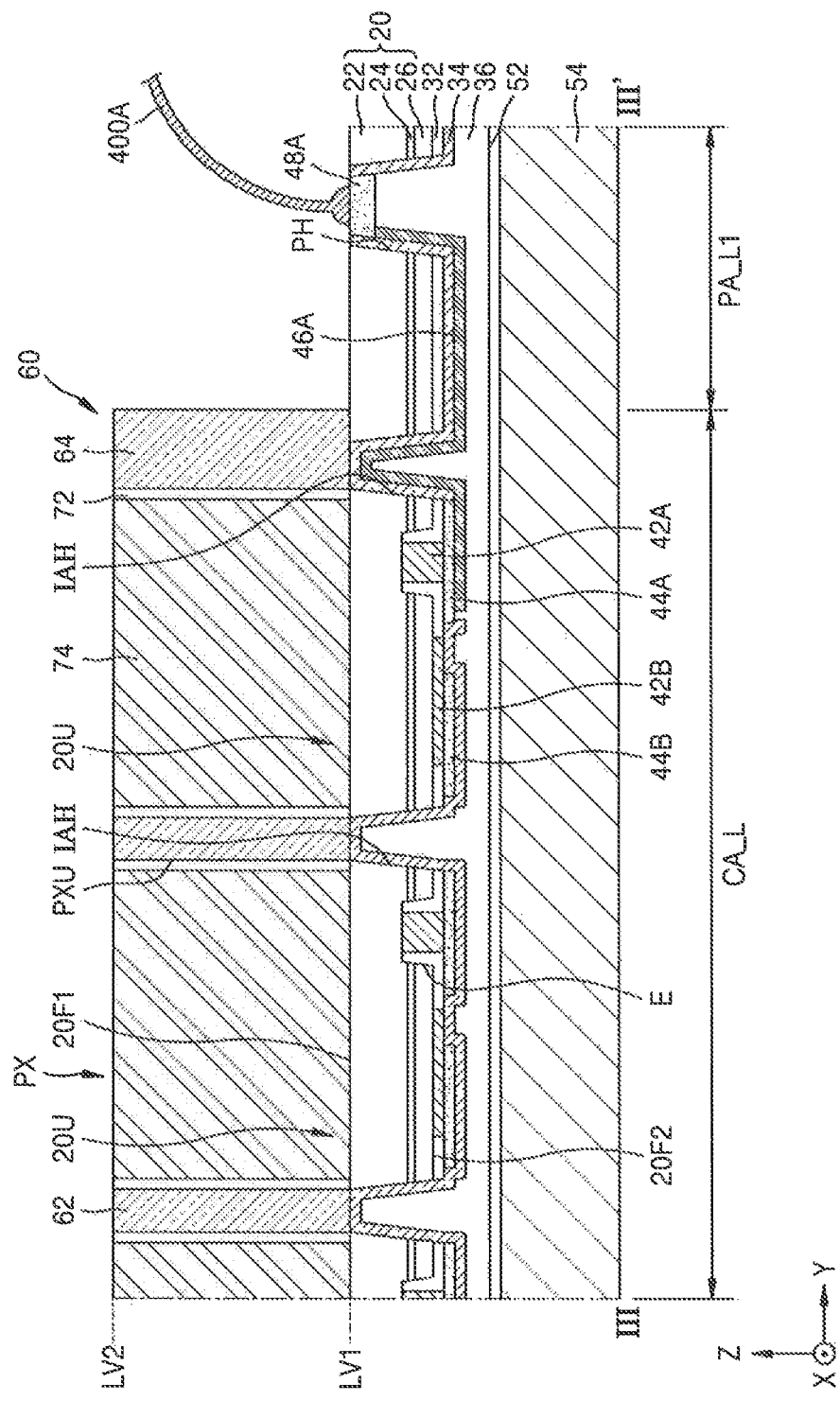
FIG. 5A is a cross-sectional view taken along line III-III' of FIG. 4
Figure 5B:
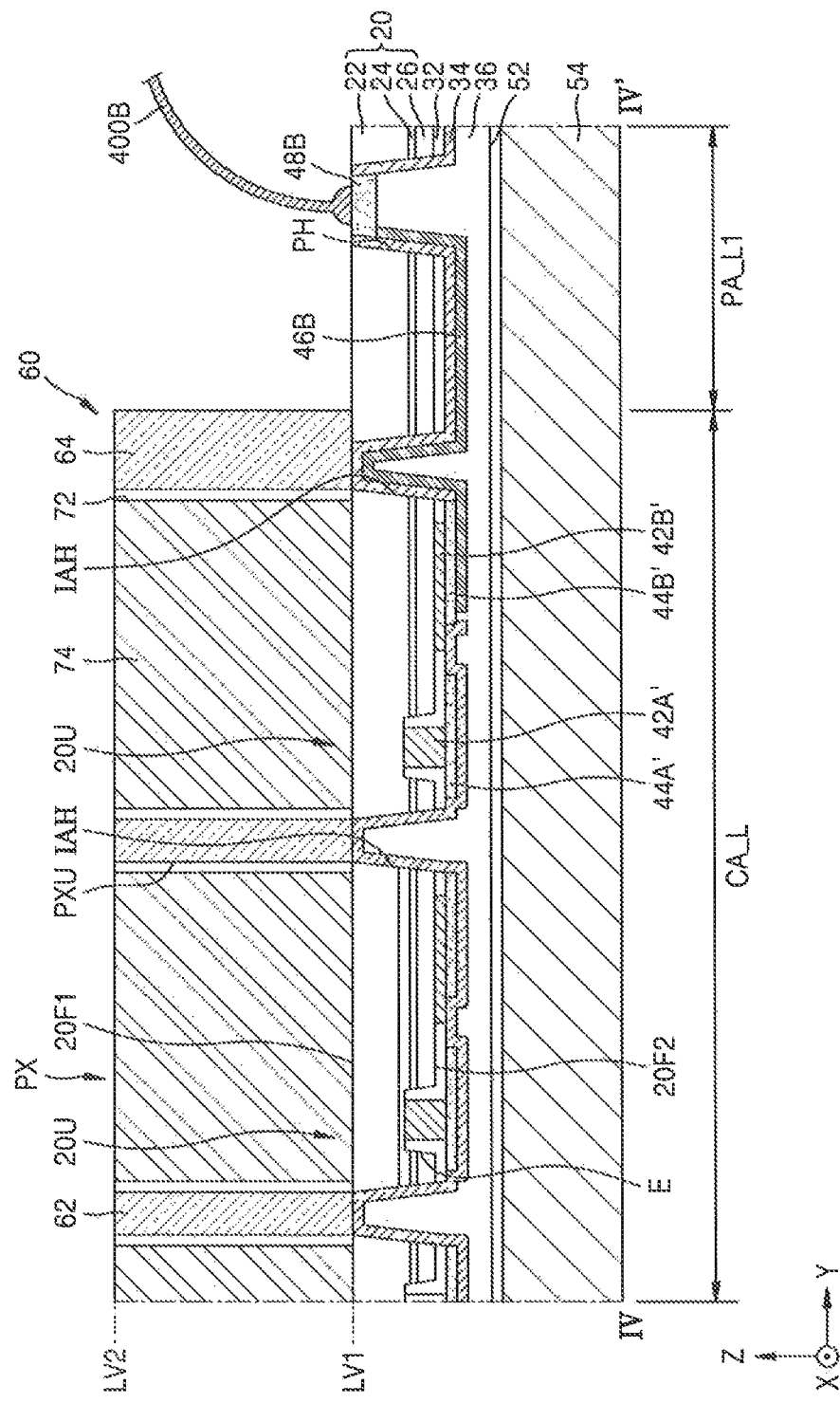
FIG. 5B is a cross-sectional view taken along line IV-IV' of FIG. 4.

FIG. 5A is a cross-sectional view taken along line III-III' of FIG. 4, and FIG. 5B is a cross-sectional view taken along line IV-IV" of FIG. 4.Only some components of the light emitting device 100 are illustrated in FIGS. 5A and 5B.

Referring to FIGS. 5A and 5B, the light emitting device 100 may include a light emitting cell region CA_L and a first pad region PA_L1. A plurality of light emitting cells PX in a matrix form may be arranged on the light emitting cell region. The plurality of light emitting cells PX may be divided into a plurality of subarrays SA1 to SA16 as illustrated in FIG. 4. Each of the plurality of light emitting cells PX may have a width of, for example, about 10 μm to several mm, in the first direction X or in the second direction Y but is not limited thereto.

A first pad 48A and a second pad 488 electrically connected to a plurality of light emitting device structures 201 may be arranged on the first pad region PA_L1. Although only one pad is illustrated in FIGS. 5A and 5B, respectively, the light emitting device 100 may include additional pads connected to the plurality of light emitting device structures 20U.

The plurality of light emitting device structures 20U may be arranged in each of the light emitting cells PX in the light emitting cell region In addition, a barrier structure 60 may be arranged on the plurality of light emitting device structures 20U, and the barrier structure 60 may be arranged to surround each of the plurality of light emitting device structures 20U in a plan view. In the first pad region PA_L1, a light emitting stack 20 may be arranged outside the barrier structure 60 and surround the plurality of light emitting device structures 20U.

The barrier structure 60 may include a first barrier layer 62 arranged between adjacent light emitting cells PX in the light emitting cell region CA_L and a second barrier layer 64 formed at the periphery of the light emitting cell region CA_L. The second barrier layer 64 may be arranged to surround the first barrier layer 62 in the plan view. The file width of the first barrier layer 62 in the horizontal direction (e,g the second direction Y) may be smaller than the width of the second barrier layer 64 in the horizontal direction. For example, the first barrier layer 62 may have a width of about 10 μm to about 100 μm, and the second barrier layer 64 may have a width of about 10 μm to about 1 mm. Accordingly, the structural stability of the light emitting device 100 may be increased. For example, even when repetitive vibrations and impacts are applied when the light emitting device 100 is used as a vehicle head lamp, the reliability of the light emitting device 100 may be increased due to the excellent structural stability between the barrier structure 60 and a fluorescent layer 74 arranged in the barrier structure 60.

The light emitting stack 20 may include a first conductivity type semiconductor layer 22, an active layer 24, and a second conductivity type semiconductor layer 26. In the light emitting cell region CA_L, the plurality of light emitting device structures 20U may be separated from each other by a device isolation opening RH. In an example process, by forming, a device isolation opening IAH by removing a portion of the light emitting stack 20, a plurality of light emitting device structures 20U may be formed on the light emitting cell region and a portion of the light emitting stack 20 surrounding the plurality of light emitting device structures 20U in the plan view may remain in the first pad region PA_L1.

The plurality of light emitting device structures 20U may include the first conductivity type semiconductor layer 22, the active layer 24, and the second conductivity type semiconductor layer 26. A first insulating layer 32, a first electrode 42A, 42A', a second electrode 42B, 42B', a first connection electrode 44A, 44A', and a second connection electrode 44B, 44B' may be further arranged on the plurality of light emitting device structures 20U.

The first conductivity type semiconductor layer 22 may include a nitride semiconductor layer having a composition of n-type $In_xAl_yGa_{(1-x-y)}N$ ($0 \leq x<1$, $0 \leq y<1$, $0 \leq x+y<1$), and the n-type impurity may be, for example, silicon (Si). For example, the first conductivity type semiconductor layer 22 may include GaN containing an n-type impurity In an exemplary embodiment of the inventive concept, the first conductivity type semiconductor layer 22 may include a first conductivity type semiconductor contact layer and a current diffusion layer. The impurity concentration of the first Conductivity type semiconductor contact layer may be about $2 \times 10^1$ atom·cm$^{-3}$ to about $9 \times 10^{19}$ atom·cm$^{-3}$. The thickness of the first conductivity type semiconductor contact layer may be about 1 μm to about 5 μm. The current diffusion layer may have a structure in which a plurality of $In_xAl_yGa_{(1-x-y)}N$ ($0 \leq x$, $y \leq 1$, $0 \leq y \leq 1$, $0 \leq x+y<1$), layers having different compositions or having different impurity contents are alternately stacked. For example, the current diffusion layer may have an n-type superlattice structure in which n-type GaN layers and/or $Al_yIn_yGa_zN$ ($0 \leq x,y,z \leq 1$, $x+y+z \neq 0$) layers each having a thickness of about 1 μm to about 500 nm are alternately stacked. The file impurity concentration of the current diffusion layer may be about $2 \times 10^{18}$ atom·cm$^{-3}$ to about $9 \times 10^{19}$ atom cm$^{-3}$.

The active layer 24 may be arranged between the first conductivity type semiconductor layer 22 and the second conductivity type semiconductor layer 26 and may emit light having energy due to the recombination of electrons and holes. The active layer 24 may have a multiple quantum well (MQW) structure in which quantum well layers and quantum barrier layers are alternately stacked. For example, the quantum well layer and the quantum barrier layer may include $In_xAl_yGa_{(1-x-y)}N$ ($0 \leq x$, $y \leq 1$, $0 \leq y \leq 1$, $0 \leq x+y<1$), having different compositions. For ON ample, the quantum well layer may include $In_xGa(1-x)N$ ($0 \leq x \leq 1$), and the quantum barrier layer may include GaN or AlGaN. The thicknesses of each of the quantum well layer and the quantum barrier layer may be about 1 nm to about 50 μm. The active layer 24 is not limited to an MQW structure and may have a single quantum well (SQW) structure.

The second conductivity type semiconductor layer 26 may include a nitride semiconductor layer having a composition of p-type $In_xAl_yGa_{(1-x-y)}N$ ($0 \leq x<1$, $0 \leq y<1$, $0 \leq x+y<1$), and the p-type impurity may be, for example, magnesium (Mg).

In an exemplary embodiment of the inventive concept, the second conductivity type semiconductor layer 26 may include an electron blocking layer, a low-concentration p-type GaN layer, and a high-concentration p-type GaN layer provided as a contact layer. For example, the electron blocking layer may have a structure in which a plurality of $In_xAl_yGa_{(1-x-y)}N$ ($0 \leq x$, $y<1$, $0 \leq y<1$, $0 \leq x+y<1$), layers each having a thickness of about 5 nm to about 100 nm and having different compositions or different impurity contents are alternately stacked. As an alternative, the electron blocking layer may include a single layer including $Al_yGa_{(1-y)}N$ ($0<y \leq 1$). The energy bandgap of the electron blocking layer may decrease moving away from the active layer 24. For example, the Al composition of the electron blocking layer may decrease moving away from the active layer 24.

The first conductivity type semiconductor layer 22, the active layer 24, and the second conductivity type semiconductor layer 26 may be sequentially stacked in the vertical direction. Herein, a top surface of the first conductivity type semiconductor layer 22 may be referred to as a first surface 20F1 of the plurality of light emitting device structures 20U and a bottom surface of the second conductivity type semiconductor layer 26 may be referred to as a second surface 20F2 of the plurality of light emitting device structures 2013.

The first electrode 42A, 42A' may be connected to the first conductivity type semiconductor layer 22 in an opening E penetrating the active layer 24 and the second conductivity type semiconductor layer 26. The second electrode 42B, 42B' may be arranged on the bottom surface (e.g., the second surface 20F2) of the second conductivity type semiconductor layer 26. The first insulating layer 32 may be arranged on an inner wall of the opening E to electrically insulate the first electrode 42A, 42A' from the active layer 24 and the second conductivity type semiconductor layer 26. The first insulating layer 32 may be arranged between the first electrode 42A, 42A' and the second electrode 42B, 42B' on the bottom surface of the second conductivity type semiconductor layer 26 and may electrically insulate the first electrode 42A, 42A' from the second electrode 42B, 42B', The first electrode 42A, 42A' and the second electrode 42B, 42B' may include Ag, Al, Ni, Cr, Au, Pt, Pd, Sn, W, Rh, Ir, Ru, Mg, Zn, or any combination thereof. The first electrode 42A, 42A' and the second electrode 42B, 42B' may include a metal material having high reflectivity.

The first connection electrode 44A, 44A) may be arranged on the first electrode 42A, 42A' and the first insulating layer 32. The second connection electrode 44B, 44B' may be arranged on the second electrode 425, 42W and the first insulating layer 32. The first connection electrode 44A, 44A' and the second connection electrode 44B, 44B' may be electrically connected to the first electrode 42A, 42A' and the second electrode 42B, 42B', respectively. The first connection electrode 44A, 44A' and the second connection electrode 44B, 44B' may include Ag, Al, Ni, Cr, Au, Pt, Pd, Sn, W, Rh, Ir, Ru, Mg, Zn, or any combination thereof.

Each of the plurality of light emitting device structures 20U may be spaced apart from an adjacent one of the light emitting device structures 2011 with the device isolation opening IAH therebetween. For example, the device isolation opening IAH may include side walls that are inclined at an angle of about 60 degrees to about 90 degrees with respect to the first surface 20F1 of the plurality of light emitting device structures 20U.

An insulating liner 34 may be conformally arranged on the inner wall of the device isolation opening 1AH, the side surface of each of the plurality of light emitting device structures 20U, and the second surface 20F2 of the plurality of light emitting device structures 20U to cover the first connection electrode 44A, 44A' and the second connection electrode 44B, 44B'. A top surface of the insulating liner 34 may be located on the same level as the first surface 20F1 of the plurality of light emitting device structures 20U. In exemplary embodiments of the inventive concept, the insulating liner 34 may include a silicon oxide or a silicon nitride.

A pad opening PH penetrating the light emitting stack 20 may be arranged on the first pad region PA_L1, and the first pad 48A and the second pad 48B may be arranged in the pad opening PH. The first pad 48A may be electrically connected to the first connection electrode 44A through a first line pattern 46A. The second connection electrode 44B may be connected to another pad through another line pattern. The second pad 48B may be electrically connected to the second connection electrode 44W through a second line pattern 46B. The first connection electrode 44A" may be connected to another pad through another line pattern.

The first line pattern 46A and the second line pattern 468 in a light emitting cell PX (e.g., the rightmost light emitting cell PX in FIGS. 5A and 5B) may extend through the device isolation opening IAH and may be connected to the first pad 48A and the second pad 48B on the first pad region PA_L1, respectively. Accordingly, the first line pattern 46A and the second line pattern 46B may be conformally arranged on the insulating liner 34 in the device isolation opening IAH.

A buried insulating layer 36 may be arranged on the insulating liner 34, the first line pattern 46A and the second line pattern 468. The buried insulating layer 36 may contact the insulating liner 34, the first line pattern 46A and the second line pattern 468 in the device isolation opening and fill the remaining space of the device isolation opening IAH. The buried insulating layer 36 may be formed using a silicone resin, an epoxy resin, or an acryl resin.

A support substrate 54 may be arranged over the buried insulating layer 36 with an adhesive layer 52 therebetween. In an exemplary embodiment of the inventive concept, the adhesive layer 52 may include an electrically insulating material, for example, resins or polymer materials such as silicon oxides, silicon nitrides, or ultraviolet (UV)-curable materials. In exemplary embodiments of the inventive concept, the adhesive layer 52 and the buried insulating layer 36 may be formed of the same material, and the boundary between the adhesive layer 52 and the buried insulating layer 36 may not be visible to the naked eye. In an exemplary embodiment of the inventive concept, the adhesive layer 52 may include a eutectic adhesive material such as AuSn or NiSi. The support substrate 54 may include, but is not limited to, a sapphire substrate, a glass substrate, a transparent conductive substrate, a silicon substrate, a silicon carbide substrate, or the like.

As described above, the harrier structure 60 may be arranged on the first surface 20F1 of the plurality of light emitting, device structures 20U. The barrier structure 60 may include silicon (Si), silicon carbide (SiC), sapphire, or gallium nitride (GaN).

The barrier structure 60 may be arranged in a matrix form in the plan view, and a plurality of pixel spaces PXU may be defined by the barrier structure 60. The barrier structure 60 may be arranged to vertically overlap the device isolation opening IAH, and the bottom surface of the barrier structure 60 may contact the top surface of the insulating liner 34, Accordingly, the first surface 20F1 of the plurality of light emitting device structures 20U may be exposed to the bottom of the plurality of pixel spaces PXU.

A reflective layer 72 may be arranged on the side wall of the barrier structure 60. The reflective layer 72 may reflect the light emitted from the plurality of light emitting device structures 20U. The reflective layer 72 may be formed on the side wall of the first barrier layer 62 and thus the side walls of the plurality of pixel spaces PXU may be covered by the reflective layer 72. The reflective layer 72 may not be formed on the side wall of the second barrier layer 64 facing the first pad region PA_L1.

In exemplary embodiments of the inventive concept, the reflective layer 72 may include a metal layer including Ag, Al, Ni, Cr, Au, Pt, Pd, ST1, W, Rh, Ir, Ru, Mg, In, or any combination thereof. In exemplary embodiments of the inventive concept, the reflective layer 72 may be a resin layer such as polyphthalamide (PPA) containing a metal oxide such as a titanium oxide or an aluminum oxide. In exemplary embodiments of the inventive concept, the reflective layer 72 may include a distributed Bragg reflector layer. For example, the distributed Bragg reflector layer may have a structure in which a plurality of insulating films having different refractive indexes are stacked repeatedly several to several hundred times. Each of the insulating films included in the distributed Bragg reflector layer may include oxides or nitrides such as $SiO_2$, SiN, $SiO_xN_y$, $TiO_2$, $Si_3N_4$, $Al_2O_3$, TiN, AlN, $ZrO_2$, TiAlN, and TiSiN, or any combination thereof.

The fluorescent layer 74 may be arranged in the plurality of pixel spaces PXU on the first surface 20F1 of the plurality of light emitting device structures 2011. As illustrated in FIGS. 5A and 5B, the fluorescent layer 74 may fill substantially all of the plurality of pixel spaces PXU and the top surface level of the fluorescent layer 74 may be equal to a top surface level LV2 of the barrier structure 60. The fluorescent layer 74 may have a substantially flat top surface.

The fluorescent layer 74 may include a single type of material capable of converting the light emitted from the plurality of light emitting device structures 20U into a desired color. Therefore, the fluorescent layer 74 capable of producing the same color may be arranged in the plurality of pixel spaces PXU. However, the inventive concept is not limited thereto. For example, the fluorescent layer 74 arranged in some pixel spaces PXU may produce a different color than the fluorescent layer 74 arranged in other pixel spaces PXU.

The fluorescent layer 74 may include a resin having a fluorescent substance dispersed therein or a film containing a fluorescent substance. For example, the fluorescent layer 74 may include a fluorescent film in which fluorescent particles are uniformly dispersed at a certain concentration. The fluorescent particles may be a wavelength conversion material for converting the wavelength of the light emitted from the plurality of light emitting device structures 20U. To increase the density of fluorescent particles and increase the color uniformity thereof, the fluorescent layer 74 may include two or more types of fluorescent particles having different size distributions.

In an exemplary embodiment of the inventive concept, the fluorescent substance may have various compositions and colors, such as oxides, silicates, nitrides, and fluorides. For example, the fluorescent substance may include β-SiAlON: Eu2+(green), (Ca,SrtAlSN3:Eu2+(red), La3Si6N11:Ce3+ (yellow), K2SiF6:Mn4+ (red), SrLiAl3N4:Eu (red), Ln4-x (EuzM1-z)xSi12-yAlyO3+x+yN18−x−y ($0.5 \leq x \leq 3$, $0 < z < 0.3$, $0 < y \leq 4$) (red), K2TiF6:Mn4+(red), NaYF4:Mn4+ (red), NaGdF4:Mn4+(red), or the like. However, the type of the fluorescent substance is not limited thereto.

In an exemplary embodiment of the inventive concept, a wavelength conversion material such as quantum dots may be further arranged on the fluorescent layer 74. The quantum dots may have a core-shell structure of a or compound semiconductor and may have a core such as CdSe or InP and a shell such as ZnS or ZnSe. In addition, the quantum dots may include a ligand for stabilizing the core and the shell.

Unlike the illustration of FIGS. 5A and B, the reflective layer 72 may not be formed on the side wall of the barrier structure 60. In this case, the side wall of the first barrier layer 62 and the side wall of the second barrier layer 64 may directly contact the fluorescent layer 74.

A top surface level LV1 of the first pad 48A and the second pad 48B in the first pad region PA_L1 may be substantially equal to the level of the first surface 20F1 of the plurality of light emitting device structures 20U. A connection member such as a bonding wire 400A, 400B for electrical connection with a driving chip (e.g., the first driving chip 210_1 of FIG. 2) may be arranged on the first pad 48A the second pad 48B in the first pad region PAA_L1. The top surface level IN2 of the barrier structure (e.g., the second barrier layer 64) at the boundary between the first pad region PA_L1 and the light emitting cell region CA_L may be higher than the top surface level L V1 of the first pad 48A and the second pad 48B.

In general, a light source module including a plurality of light emitting device chips may be used for an intelligent illumination system such as a vehicle head, lamp, and various light emission modes may be implemented according to the surrounding circumstances by individually controlling the light emitting device chips. When a plurality of light emitting devices are arranged in a matrix form, the light emitted from each of the plurality of light emitting devices may be mixed with or infiltrate into nearby (e.g., adjacent) light emitting devices. Thus, the contrast characteristics of the light source module may not be ideal.

However, according to an exemplary embodiment of the inventive concept, the barrier structure 60 may prevent the light emitted by one light emitting cell PX from being mixed with or infiltrated into a nearby or adjacent light emitting cell PX, and thus, the contrast characteristics of the light emitting device 100 may be excellent. In addition, since the plurality of light emitting device structures 20U are completely isolated from each other by the device isolation opening IAH, the light emitted from the plurality of light emitting device structures 20U may be prevented from being mixed with or infiltrated into nearby or adjacent light emitting device structures 20U, thereby contributing to the excellent contrast characteristics of the light emitting device 100.

Figure 6A:
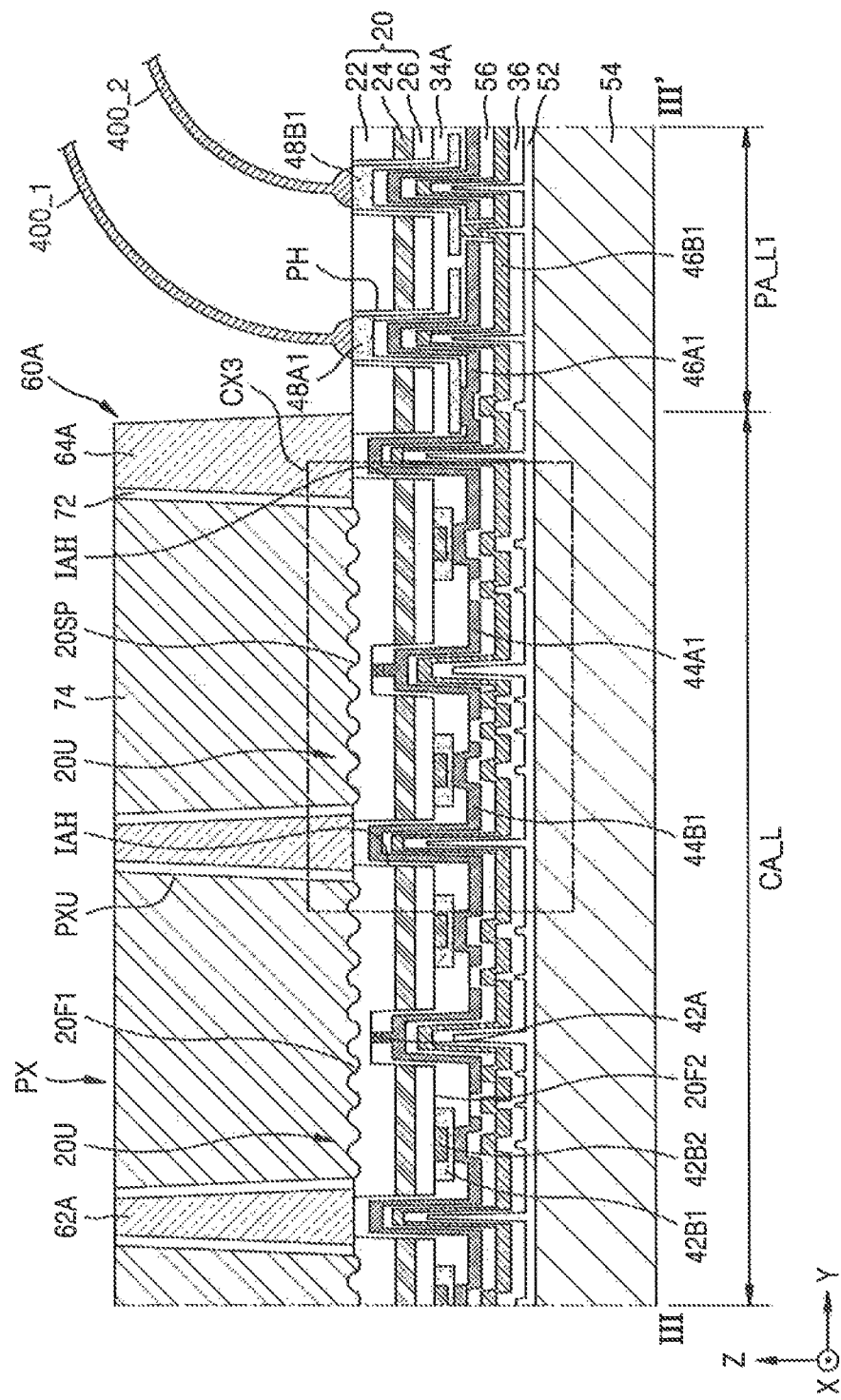
FIG. 6A is a cross-sectional view illustrating a light emitting device according to an exemplar embodiment of the inventive concept and FIG. 6B is an enlarged cross-sectional view of a portion CX3 in FIG. 6A.
Figure 6B:
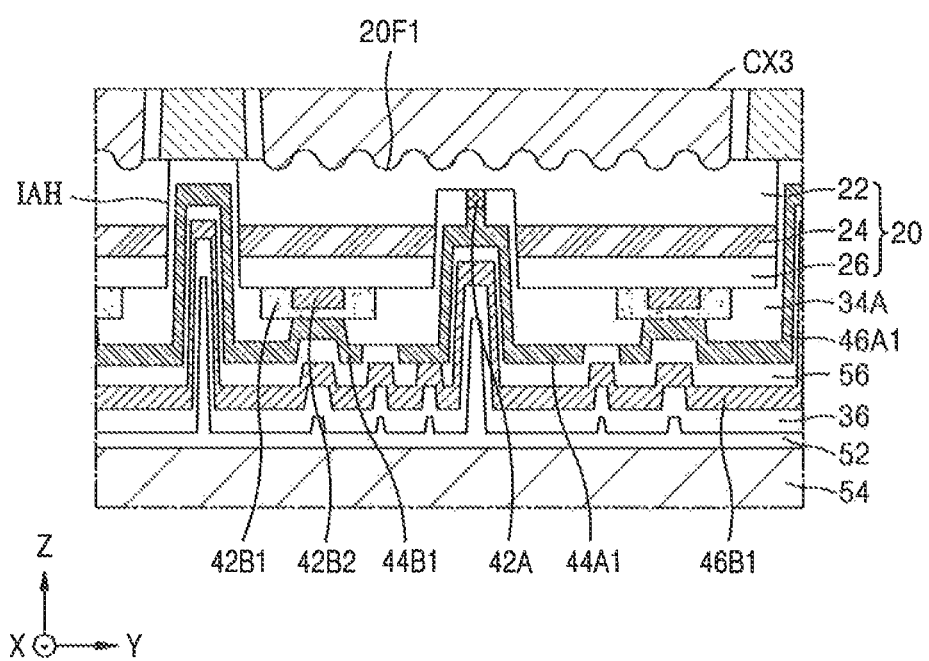

FIG. 6A is a cross-sectional view illustrating a light emitting device according, to an exemplary embodiment of the inventive concept, and FIG. 6B is an enlarged cross-sectional view of a portion CX3 in FIG. 6A.

Referring to FIGS. 6A and 6B, a barrier structure 60A may include a first barrier layer 62A having inclined side walls and a second barrier layer 64A having inclined side walls. The width of the first barrier layer 62A in the horizontal direction (e.g., the second direction Y) and the width of the second barrier layer 64A in the horizontal direction may gradually decrease moving away from the third direction Z. The width of each of a plurality of pixel spaces PXU in the horizontal direction (e.g., the second direction Y) may gradually increase moving away from a first surface 20F1 of a light emitting device structure 20U and thus, the light extraction efficiency from the light emitting device structure 20U may be increased.

As illustrated in FIGS. 6A and 6B, an uneven structure 20SP may be formed at the first surface 20F1 of a plurality of light emitting device structures 20U and thus the light extraction efficiency from the light emitting device structure 20U may be increased.

In an exemplary embodiment of the inventive concept, a second electrode 42B1 may be arranged on a second conductivity type semiconductor layer 26, and a second contact layer 42B2 may be formed between the second conductivity type semiconductor layer 26 and the second electrode 42B1. In addition, an insulating liner 34A may be conformally formed on an inner wall of a device isolation opening IAH and a second surface 20F2 of the plurality of light emitting device structures 20U and may surround a first electrode 42A and the second electrode 42B1. Although the insulating liner 34A is illustrated as a single layer in FIGS. 6A and 6B, the insulating liner 34A may alternatively have a multi-layer structure including a plurality of insulating layers. A first connection electrode 44A1 and a second connection electrode 44B1 may be arranged on the insulating liner 34A and may be electrically connected to the first electrode 42A and the second electrode 42B1, respectively.

First pads 48A1 and 48B1 may be conformally arranged on an inner wall of a pad opening PH, and the insulating liner 34A may be arranged between the first pads 48A1 and 48B1 and a light emitting stack 20. The first pads 48A1 and 48B1 may be electrically connected to the first connection electrode 44A1 and the second connection electrode 44B1 through a first line pattern 46A1 and a second line pattern 46B1, respectively.

An intermediate insulating layer 56 may be arranged on the first connection electrode 44A1, the second connection electrode 44B1, and the first line pattern 46A1. The second line pattern 46B1 may be arranged on the intermediate insulating layer 56 and may be connected to one of the first pads 48A1 and 48B1 through the intermediate insulating layer 56. Since the intermediate insulating layer 56 is arranged between the first line pattern 46A1 and the second line pattern 46B1, the first line pattern 46A1 and the second line pattern 46B1 may be spaced apart from each other in the vertical direction Z. However, the arrangement of the first and second line patterns 46A1 and 46B1 is not limited thereto.

In a first pad region PA_L1, connection members such as bonding wires 400_1 and 400_2 for electrical connection with a driving chip (e.g., the first driving chip 210_1 of FIG. 2) may be arranged on the first pads 48A1 and 48B1 respectively.

According to the above light emitting device, the barrier structure 60A may prevent the light emitted from one pixel PX from being mixed or infiltrated into an adjacent pixel PX, and thus, the contrast characteristics of the light emitting device may be excellent. In addition, since the barrier structure 60A has inclined side walls, the light extraction efficiency from the light emitting device structure 20U may be increased.

Figure 7:
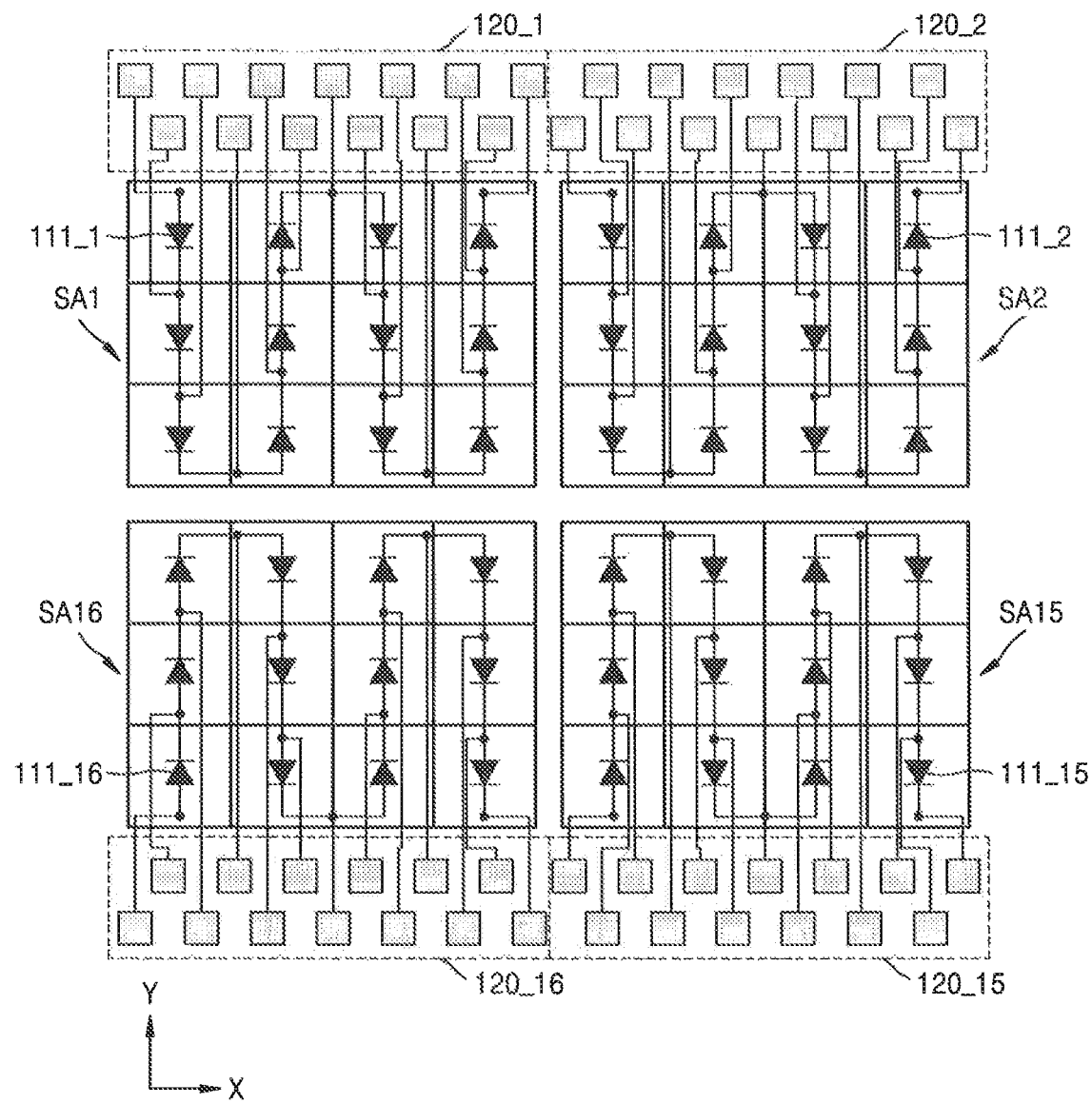
FIG. 7 is a circuit diagram illustrating a connection relationship of subarrays and pads included in a light emitting device according to an exemplary embodiment of the inventive concept.

FIG. 7 is a circuit diagram illustrating a connection relationship of subarrays and pads included in a light emitting device according to an exemplary embodiment of the inventive concept. FIG. 7 is an equivalent circuit diagram illustrating the first, second, fifteenth, and sixteenth subarrays SA1, SA2, SA15, and SA16 of FIG. 4 and a plurality of pads connected to the first, second, fifteenth, and sixteenth subarrays SA1, SA2, SA15, and SA16. In FIG. 7, one light emitting cell may correspond to one diode.

Referring to FIGS. 4 and 7, each of the first, second, fifteenth, and sixteenth subarrays SA1, SA2, SA15, and SA16 may include a plurality of light emitting cells implemented by LEDs. Although FIG. 7 illustrates that each of the first, second, fifteenth, and sixteenth subarrays SA1, SA2, SA15, and SA16 includes twelve light emitting cells, the inventive concept is not limited thereto and the number of light emitting cells included in one subarray may be more or less than twelve. Although only the first, second, fifteenth, and sixteenth subarrays SA1, SA2, SA15, and SA16 are illustrated in FIG. 7, the same description may also be applied to the other subarrays illustrated in FIG. 4.

The plurality of subarrays SA1 to SA16 including the first, second, fifteenth, and sixteenth subarrays SA1, SA2, SA15, and SA16 may be electrically insulated from each other, and the plurality of subarrays SM to SA16 may be controlled by different driving chips respectively. In the light emitting device 100 according to an exemplary embodiment of the inventive concept, since the plurality of light emitting cells constituting an LED array are subdivided into the plurality of subarrays SA1 to SA16, operations of the individual subarrays may be respectively controlled by different driving chips, and thus, the light emitting device may be easily controlled. For example, the brightness adjustment of the light emitting device may be subdivided and the brightness adjustment speed of the light emitting device may be increased.

Light emitting cells included in each subarray, fear example, a plurality of first light emitting cells 111_1 included in the first subarray SA1, may be electrically connected to each other by one of a cathode and an anode. A plurality of light emitting cells included in one subarray may be connected to a driving chip that drives each of the light emitting cells in an on or off state. Here, the driving chip may adjust the brightness of each of the plurality of light emitting cells through a pulse width modulation (PWM) method. For example, the plurality of first light emitting cells 111_1 may be connected to a first driving chip (e.g., 210_1 of FIG. 2) and the first driving chip may adjust the brightness of each of the plurality of first light emitting cells 111_1 by pulse width modulation. The plurality of first light emitting cells 111_1 included in the first subarray SA1 may be connected in series to each other, and both ends of the plurality of first light emitting cells 111_1 may be connected to different pads respectively. Since the plurality of first light emitting cells 111_1 are connected in series to each other, when the voltage applied to nodes where the plurality of first light emitting cells 111_1 are connected to each other is controlled, the operation of the plurality of first light emitting cells 111_1 may be controlled. Thus, the number of a plurality of first pads 120_1 connected to the plurality of first light emitting cells 111_1 may be smaller than double the number of the plurality of first light emitting cells 111_1. The first driving, chip may be electrically connected to the plurality of first pads 120_1. By adjusting the voltage applied to two different pads among the plurality of first pads 120_1, the first driving chip may drive one light emitting cell having a cathode and an anode connected to the two pads respectively. In other words, the first driving chip may apply a voltage to the plurality of first pads 120_1 to drive at least one of the plurality of first light emitting cells 111_1, thereby adjusting the brightness of the light emitted from the at least one of the plurality of first light emitting cells 111_1.

A plurality of second light emitting cells 1112 included in the second subarray SA2 may be connected in series to each other, and both ends of the plurality of second light emitting cells 111_2 ma be connected to different pads respectively. Since the plurality of second light emitting cells 111_2 are connected in series to each other, when the voltage applied to nodes where the plurality of second light emitting cells 111_2 are connected to each other is controlled, the operation of the plurality of second light emitting cells 111_2 may be controlled. Thus, the number of a plurality of second pads 120_2 connected to the plurality of second light emitting cells 111_2 may be smaller than double the number of the plurality of second light emitting cells 111_2.

A second driving chip (e.g., 210_2 of FIG. 21 may be electrically connected to the plurality of second pads 120_2. By adjusting the voltage applied to two different pads among the plurality of second pads 120_2, the second driving chip may drive one light emitting cell having a cathode and an anode connected to the two pads respectively.

Thus, according to the arrangement order of the first subarray SA1 and the second subarray SA2, the plurality of first pads 120_1 and the plurality of second pads 120_2 corresponding respectively to the first subarray SA1 and the second subway SA2 may be arranged sequentially. In addition, according to the arrangement order of the plurality of subarrays SA1 to SA16, a plurality of pads corresponding respectively to the plurality of subways SA1 to SA16 may be arranged sequentially.

In an exemplary embodiment of the inventive concept, the sixteenth subarray SA and the first subarray SA1 may be formed symmetrical to each other with respect to an axis parallel to the first direction X, A plurality of the sixteenth pads 120_16 connected to the sixteenth subarray SA and the plurality of first pads 120_1 connected to the first subarray SA1 may be formed symmetrical to each other with respect to an axis parallel to the first direction X.

In an exemplary embodiment of the inventive concept, the fifteenth subarray SA15 and the second subarray SA2 may be formed symmetrical to each other with respect to an axis parallel to the first direction X. A plurality of the fifteenth pads 120_15 connected to the fifteenth subarray SA15 and the plurality of second pads 120_2 connected to the second subway SA2 may be formed symmetrical to each other with respect to an axis parallel to the first direction X.

Referring to FIGS. 2 and 3, since the plurality of driving chips 210_1 to 210_16 are electrically connected in series, the directions of receiving the control signal CS by the first driving chip 210_1 and the sixteenth driving chip 210_16 may be opposite to each other. For example, the first driving chip 210_1 may receive the control signal CS from the input unit 300 in the first direction X, and the sixteenth driving chip 210_16 may receive the control signal CS from the fifteenth driving chip 210_15 in the opposite direction (−X) of the first direction X. Since the sixteenth subarray SA16 is formed symmetrical to the first subarray SA1 with respect to an axis parallel to the first direction X and the plurality of the sixteenth pads 120_16 are formed symmetrical to the plurality of first pads 120_1 with respect to an axis parallel to the first direction X, the method of electrically connecting the first driving chip 210_1 and the first subarray SA1 and the method of electrically connecting the sixteenth driving chip 210_16 and the sixteenth subarray SA16 may be similar to each other. Thus, the bonding wires 400 electrically connecting the first driving chip 2101 and the plurality of first pads 120_1 and the bonding wires 400 electrically connecting the sixteenth driving chip 210_16 and the plurality of sixteenth pads 120_16 may be easily formed. The above description may also be applied to the other subarrays and pads. In other words, at least two subarrays among the subarrays arranged in parallel in the second direction Y may be formed symmetrical to each other with respect to an axis parallel to the first direction X, and the pads connected respectively to the two subarrays may be formed symmetrical to each other with respect to an axis parallel to the first direction X.

Figure 8:
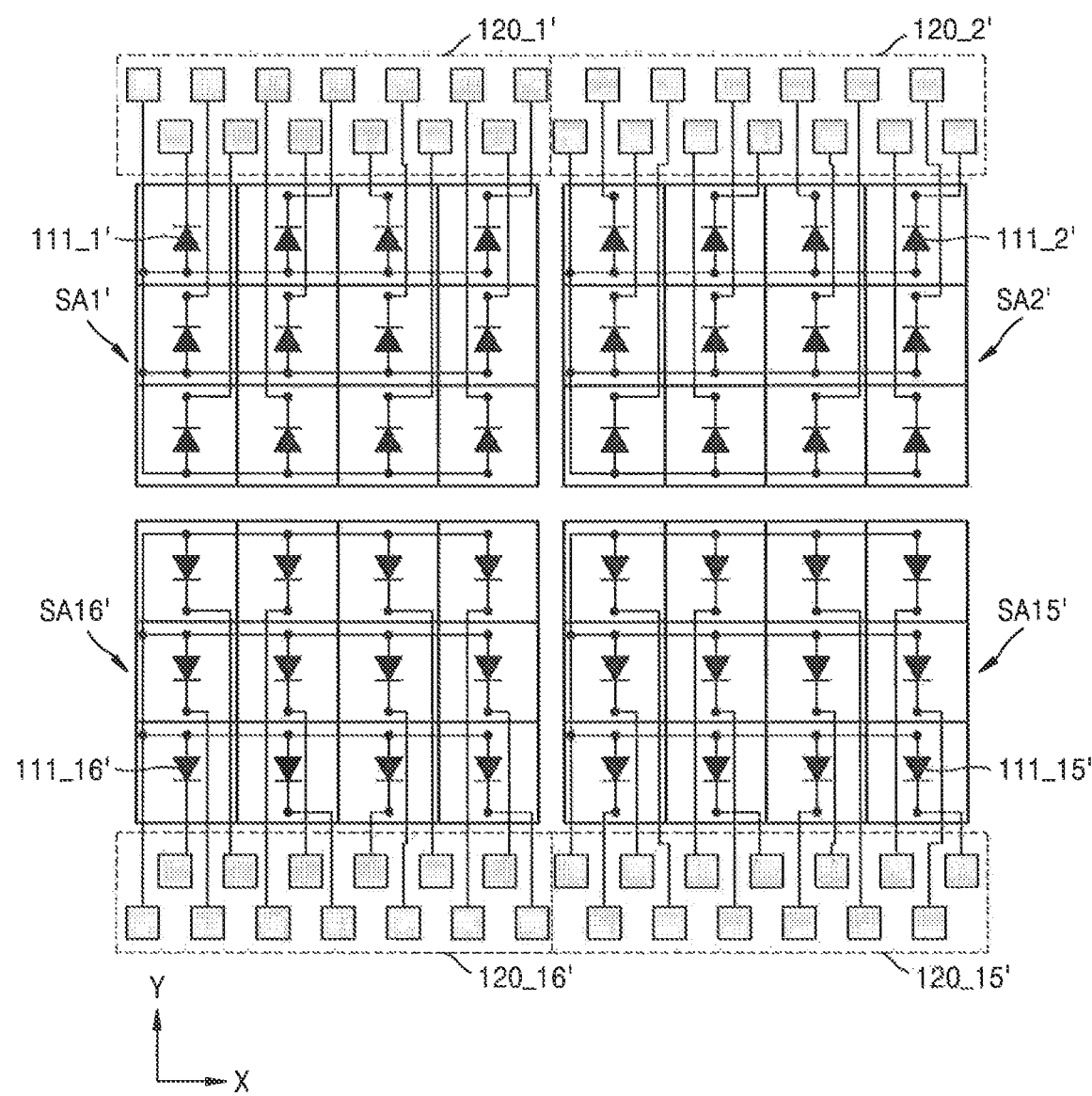
FIG. 8 is a circuit diagram illustrating a connection relationship of subarrays and pads included in a light emitting device according to an exemplary embodiment of the inventive concept.

FIG. 8 is a circuit diagram illustrating a connection relationship of subarrays and pads included in a light emitting device according to an exemplary embodiment of the inventive concept. FIG. 8 is an equivalent circuit diagram illustrating the first, second, fifteenth, and sixteenth subarrays SA1, SA2, SA15, and SA16 of FIG. 4 and a plurality of pads connected to the subarrays. In FIG. 8, one light emitting cell may correspond to one diode.

Referring to FIG. 8, each of first, second, fifteenth, and sixteenth subarrays SA1', SA1', SA15', and SA16' may include a plurality of light emitting cells implemented by LEDs. Although FIG. illustrates that each of the first, second, fifteenth, and sixteenth subarrays SA1', SA2', SA15', and SA16' includes twelve light emitting cells, the inventive concept is not limited thereto and the number of light emitting cells included in one subarray may be less than or more than twelve. Although only the first, second, fifteenth, and sixteenth subarrays SA1', SA2', SA15', and SA16' are illustrated in FIG. 8, the same description may also be applied to the other subarrays illustrated in FIG. 4.

A plurality of first light emitting cells 111_1' included in the first subarray SA1' may be connected in parallel to each other, and both ends of the plurality of first light emitting cells 111_1' may be connected to different pads respectively.

In an exemplary embodiment of the inventive concept, anodes of the plurality of first light emitting cells 111_1' may be connected to each other; however, the light emitting device according to an exemplary embodiment of the inventive concept is not limited thereto. For example, cathodes of the plurality of first light emitting cells 111_1' may be connected to each other.

Since a plurality of first pads 1201' may be connected to one node where the anodes of the plurality of first light emitting cells 111_1' are connected to each other and may be connected to the cathodes of the plurality of first light emitting cells 111_1', the number of the plurality of first pads 120_1' may be smaller than double the number of the plurality of first light emitting cells 111_1'.

In an exemplary embodiment of the inventive concept, a first driving chip (e.g., 210_1 of FIG. 2) may be electrically connected to the plurality of first pads 120_1'. By adjusting the voltage applied to two different pads among the plurality of first pads 120_1', the first driving chip may control the driving of one light emitting cell having a cathode and an anode electrically connected to the two pads respectively.

A plurality of second light emitting cells 111_2' included in the second subarray SA2' may be connected in parallel to each other, and both ends of the plurality of second light emitting cells 111_2' may be connected to different pads respectively. In an exemplary embodiment of the inventive concept, anodes of the plurality of second light emitting cells 111_2' may be connected to each other; however, the light emitting device according to an exemplary embodiment of the inventive concept is not limited thereto. For example, cathodes of the plurality of second light emitting cells 111_2' may be connected to each other.

Since a plurality of second pads 120_2' may be connected to one node where the anodes of the plurality of second light emitting cells 111_2' are connected to each other and may be connected to the cathodes of the plurality of second light emitting cells 111_2', the number of the plurality of second pads 120_2' may be smaller than double the number of the plurality of second light emitting cells 111_2'.

In an exemplary embodiment of the inventive concept, a second driving chip (e.g., 210_2 of FIG. 2) may be electrically connected to the plurality of second pads 120_2'. By adjusting the voltage applied to two different pads among the plurality of second pads 120_2', the second driving chip may control the driving of one light emitting cell having a cathode and an anode electrically connected to the two pads respectively.

In an exemplary embodiment of the inventive concept, the sixteenth subarray SA16' and the first subarray SA16' may be formed symmetrical to each other with respect to an axis parallel to the first direction X. A plurality of the sixteenth pads 120_16' connected to the sixteenth subarray SA16' and the plurality of first pads 120_1' connected to the first subarray SAF may be formed symmetrical to each other with respect to an axis parallel to the first direction X. A plurality of sixteenth light emitting cells 111_16' included in the sixteenth subarray SA16' may be connected in parallel to each other, and both ends of the plurality of sixteenth light emitting cells 111_16' may be connected to different pads respectively.

In an exemplary embodiment of the inventive concept, the fifteenth subarray SA15' and the second subarray SA2' may be tinned symmetrical to each other with respect to an axis parallel to the first direction X. A plurality of the fifteenth pads 120_15' connected to the fifteenth subarray SA15' and the plurality of second pads 120_2' connected to the second subarray SAT may be formed symmetrical to each other with respect to an axis parallel to the first direction X. In other words, at least two subarrays among the subways arranged in parallel in the second direction Y may be formed symmetrical to each other with respect to an axis parallel to the first direction X, and the pads connected respectively to the two subarrays may be formed symmetrical to each other with respect to an axis parallel to the first direction X. A plurality of fifteenth rat emitting cells 111_15' included in the fifteenth subarray SA15' may be connected in parallel to each other, and both ends of the plurality of fifteenth light emitting cells 111_15' may be connected to different pads respectively.

As illustrated in FIGS. 7 and 8, a plurality of light emitting cells included in one subarray may be connected in series to each other or may be connected in parallel to each other. However, the light emitting device according to an exemplary embodiment of the inventive concept is not limited thereto. For example, light emitting cells in a first group of subways included in the light emitting device may be connected in series to each other and light emitting cells in a second group of the subarrays included in the light emitting device may be connected in parallel to each other. Alternatively, at least one of the plurality of subarrays may be configured such that some of its light emitting cells are connected in series to each other and some of its light emitting cells are connected in parallel to each other. For example, every six of the plurality of first light emitting cells 111_1' may be connected in series to each other to form cell groups, and the cell groups may be connected in parallel to each other.

FIGS. 9A to 9L are sequential cross-sectional views illustrating a method of manufacturing a light emitting device according to an exemplary embodiment of the inventive concept. FIGS. 9A to 9L are cross-sectional views corresponding to the cross section taken along line III-III' of FIG. 4.

Referring to FIG. 9A, a light emitting stack 20 may be formed on a substrate 1.

In an exemplary embodiment of the inventive concept, the substrate 1 may include, for example, a silicon (Si) substrate, a silicon carbide (SiC) substrate, a sapphire substrate, or a gallium nitride (GaN) substrate. The substrate 1 may include a light emitting cell region CA_L and a first pad region PA_L1. In a plan view, the light emitting cell region CA_L may be arranged in a central region of the light emitting device and the first pad region PA_L1 may be arranged in a peripheral region.

The light emitting stack 20 may include a first conductivity type semiconductor layer 22, an active layer 24, and a second conductivity type semiconductor layer 26 that are formed sequentially OD a first surface 10E1 of the substrate 1.

Figure 9B:
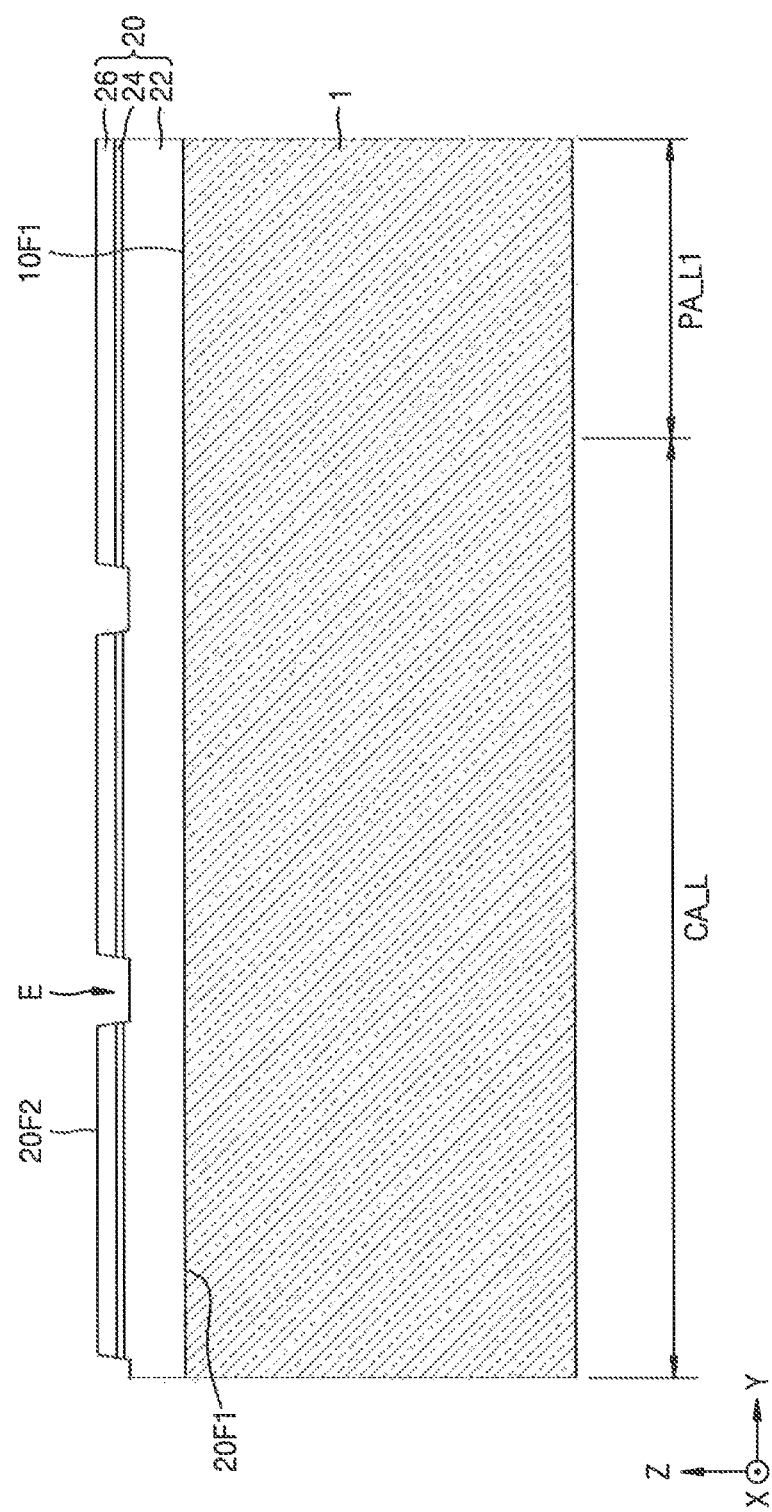

Referring to FIG. 9B, a mask pattern may be formed on the light emitting stack 20, and the mask pattern may be used as an etch mask to remove a portion of the light emitting stack 20 to form an opening E. The opening E may expose a top surface of the first conductivity type semiconductor layer 22. The opening E may not be formed on the first pad region PA_L1 of the substrate 1.

Figure 9C:
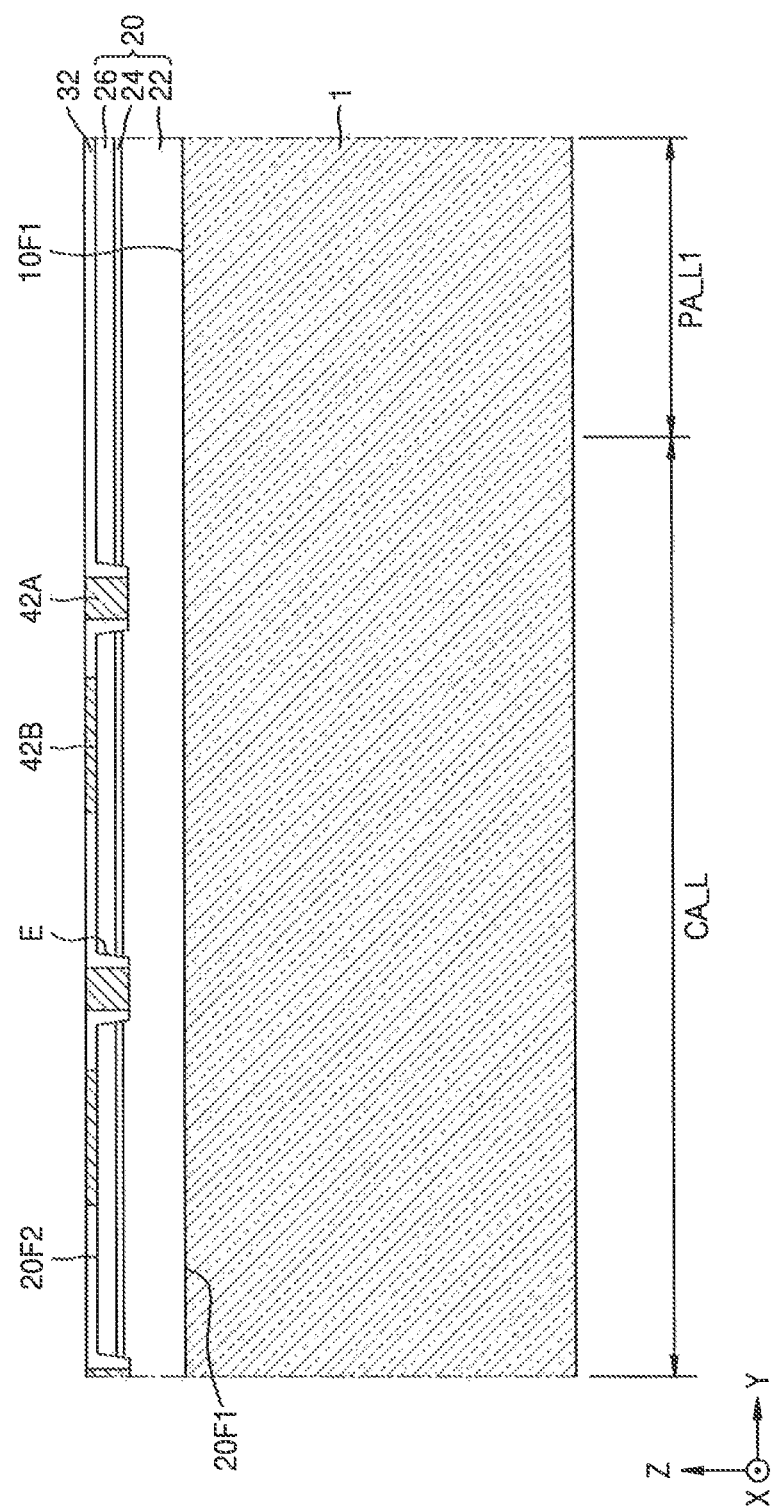

Referring to FIG. 9C, a first insulating layer 32 may be formed on the light emitting stack 20 to conformally cover the opening E. The first insulating layer 32 may be formed on both the light emitting cell region CA_L and the first pad region PA_L1.

Thereafter, a portion of the first insulating layer 32 may be removed in the opening E and a portion of the first insulating layer 32 may be removed on the second conductivity type semiconductor layer 26 to expose the top surfaces the first conductivity type semiconductor layer 22 and the second conductivity type semiconductor layer 26, respectively.

A first electrode 42A and a second electrode 42B may be formed on the exposed top surfaces of the first conductivity type semiconductor layer 22 and the second conductivity type semiconductor layer 26, respectively. In addition, a, first contact layer formed of a conductive ohmic material may be formed between the first electrode 42A and the first conductivity type semiconductor layer 22, and a second contact layer formed of a conductive ohmic material may be formed between the second electrode 4213 and the second conductivity type semiconductor layer 26.

Figure 9D:
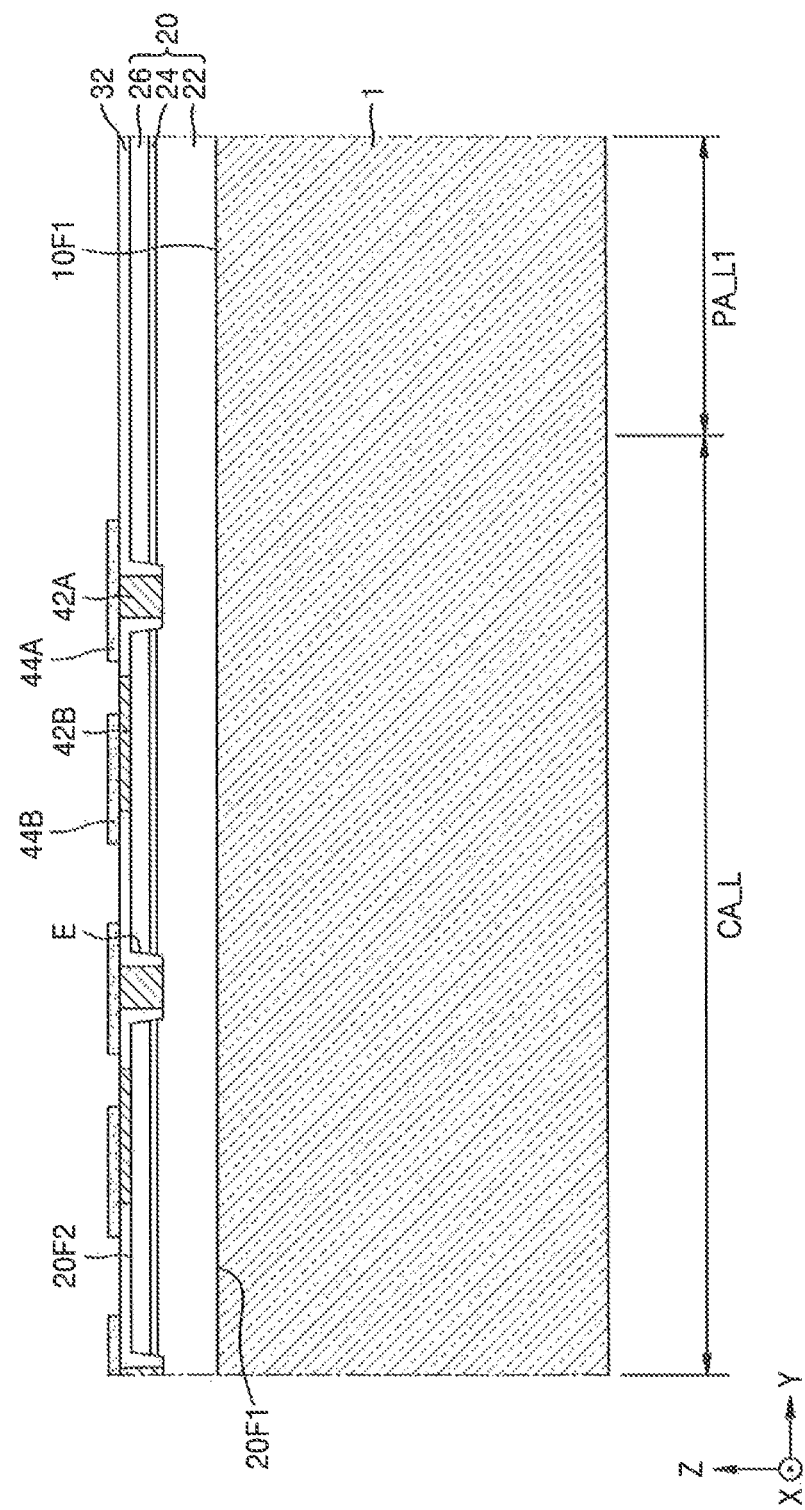

Referring to FIG. 9D, a first connection electrode 44A and a second connection electrode 44B may be formed on the first insulating layer 32 and electrically connected respectively to the first electrode 42A and the second electrode 42B, In an exemplary embodiment of the inventive concept, a conductive layer may be formed on the first electrode 42A, the second electrode 42B, and the first insulating layer 32, and the conductive layer may be patterned to form the first connection electrode 44A and the second connection electrode 44B. In an exemplary embodiment of the inventive concept, the first connection electrode 44A and the second connection electrode 44B may be formed by a plating process.

Figure 9E:
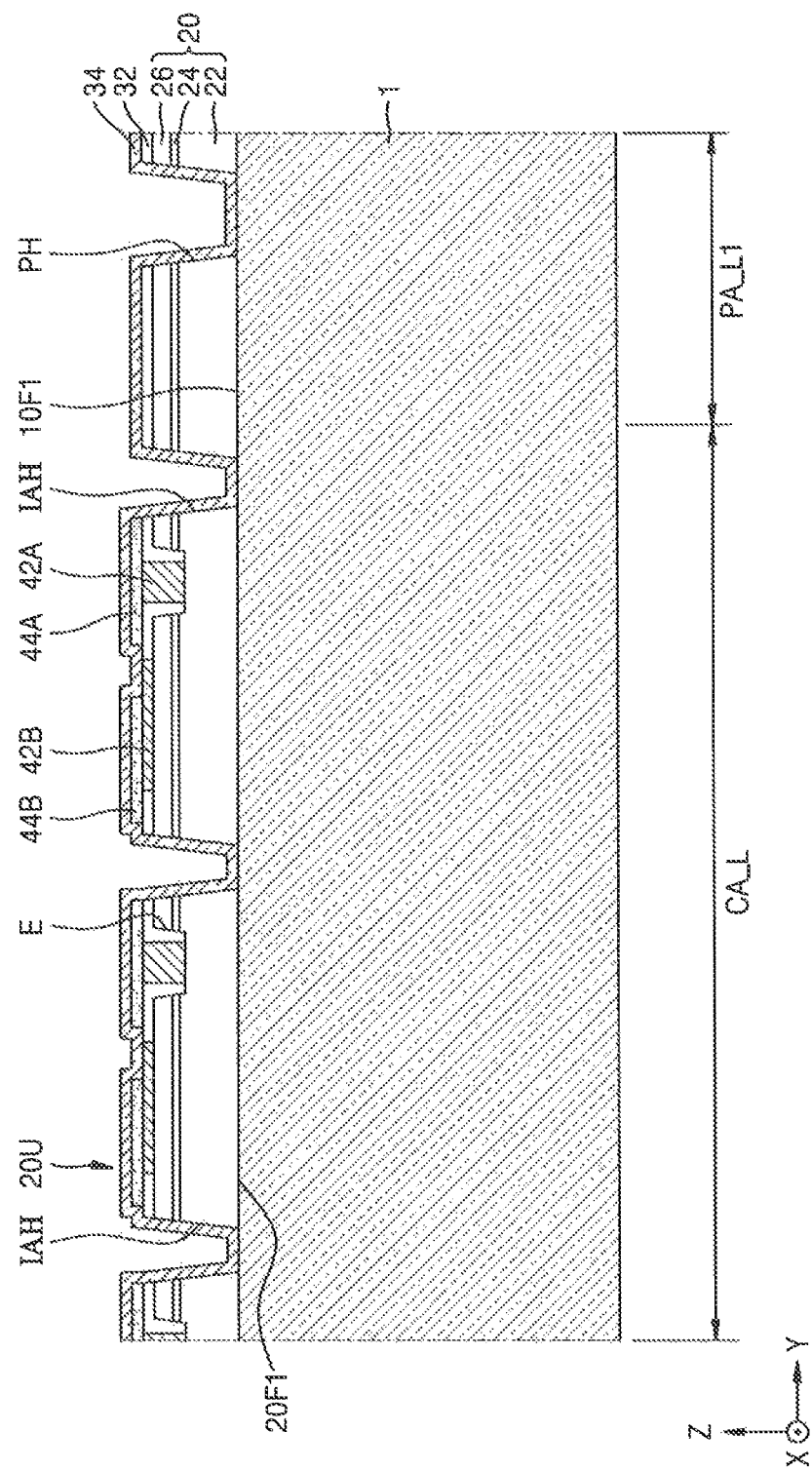

Referring to FIG. 9E, a portion of the light emitting stack 20 may be removed to form a device isolation opening and a pad opening PH in the light emitting cell region CA_L and the first pad region PA_L1, respectively. The device isolation opening IAH and the pad opening PH may completely penetrate the light emitting stack 20 to expose the first surface 101_1 of the substrate 1 to the bottom of the device isolation opening IAH and the bottom of the pad opening PH.

In the light emitting cell region CA_L, the light emitting stack 20 may be divided into a plurality of light emitting device structures 20U by the device isolation opening IAH. In an exemplary embodiment of the inventive concept, a process of forming the device isolation opening IAH may be performed by a blade; however, the inventive concept is not limited thereto. As illustrated in FIG. 9E, the side cross-sectional shape of the plurality of light emitting device structures 20U may have a trapezoidal shape whose top portion is shorter than the bottom portion, however, the inventive concept is not limited thereto.

Thereafter, an insulating liner 34 may be formed on the top surfaces and side walls of the plurality of light emitting device structures 20U and the light emitting stack 20. The insulating liner 34 may be conformally formed on the inner wall of the device isolation opening IAH and the inner wall of the pad opening PH and may contact the first surface 10F1 of the substrate 1 at the bottom of the device isolation opening IAH and the bottom of the pad opening PH.

Since one light emitting device structure 20U is physically and electrically isolated from an adjacent light emitting device structure 20U by the device isolation opening IAH and the insulating liner 34, the light emitted from the one light emitting device structure 20U may not be absorbed or infiltrated into the adjacent light emitting device structure 20U and thus the contrast characteristics of the light emitting device 100 may be increased.

Figure 9F:
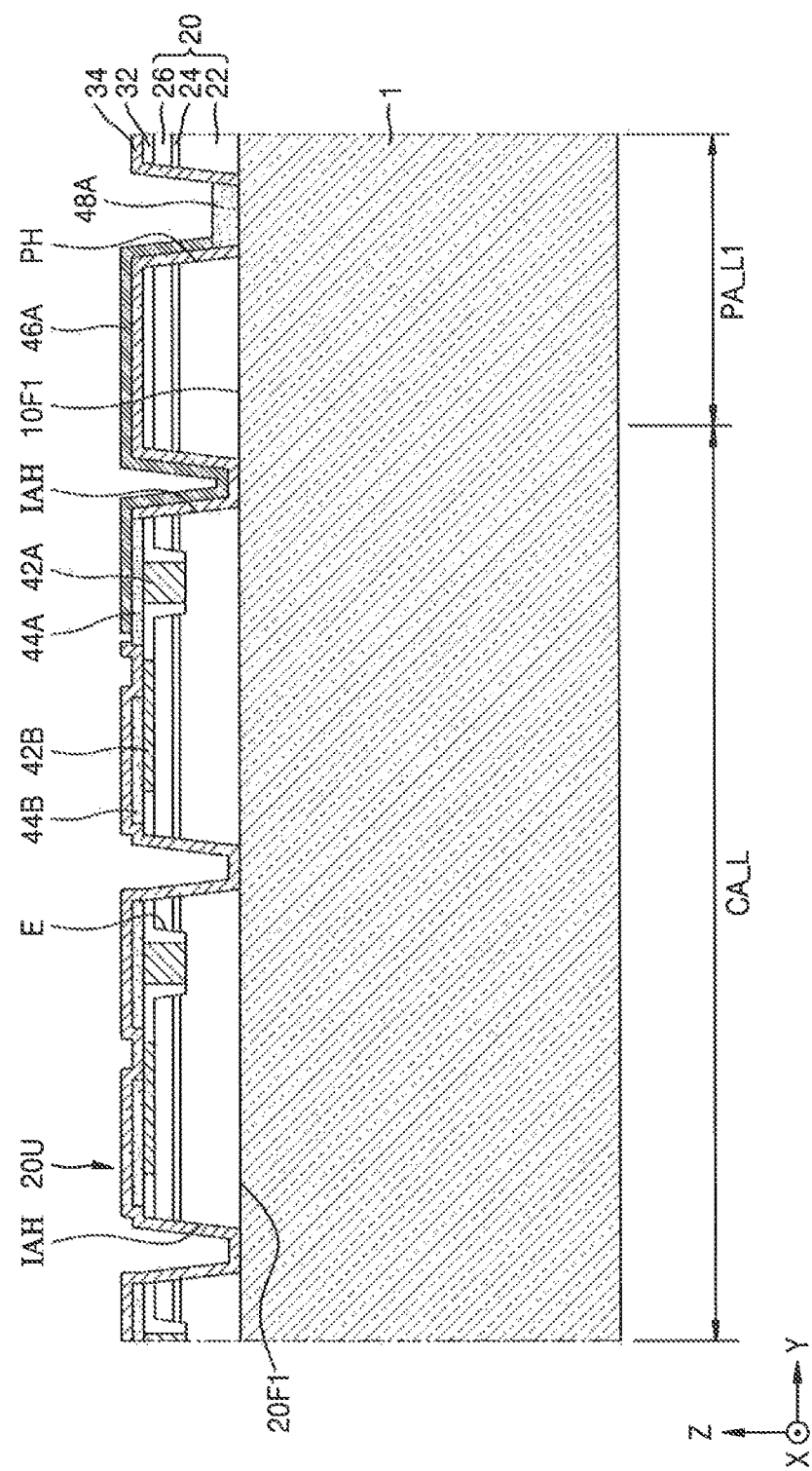

Referring to FIG. 9F, a portion of the insulating liner 34 may be removed to expose the top surface of the first connection electrode 44A. Although not shown in FIG. 9F, a portion of the insulating liner 34 may be removed to expose the top surface of the second connection electrode 44B. In addition, a portion of the insulating liner 34 arranged at the bottom of the pad opening may be removed to expose the first surface 10F1 of the substrat.

Thereafter, a first line pattern 46A electrically connected to the first connection electrode 44A may be formed on the insulating liner 34. Although not shown in FIG. 9F, another line pattern electrically connected to the second connection electrode 44B may be formed on the insulating liner 34.

In addition, a first pad 48A electrically connected to the first connection electrode 44A may be formed in the pad opening PH. In an exemplary embodiment of the inventive concept, the first line pattern 46A may be formed and then the first pad 48A may be formed. Alternatively, the first line pattern 46A and the first pad 48A may be formed simultaneously.

Figure 9G:
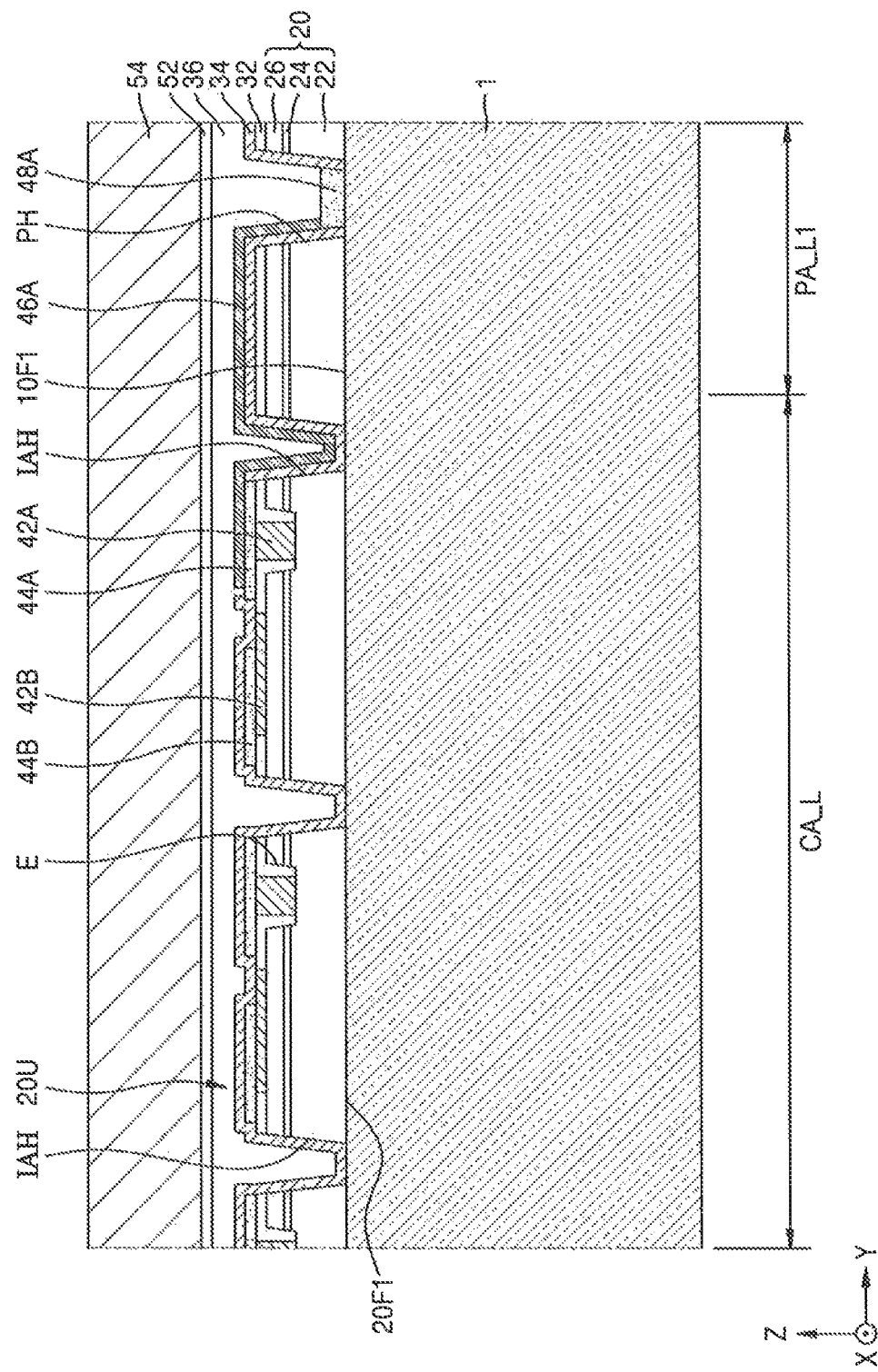
Figure 9H:
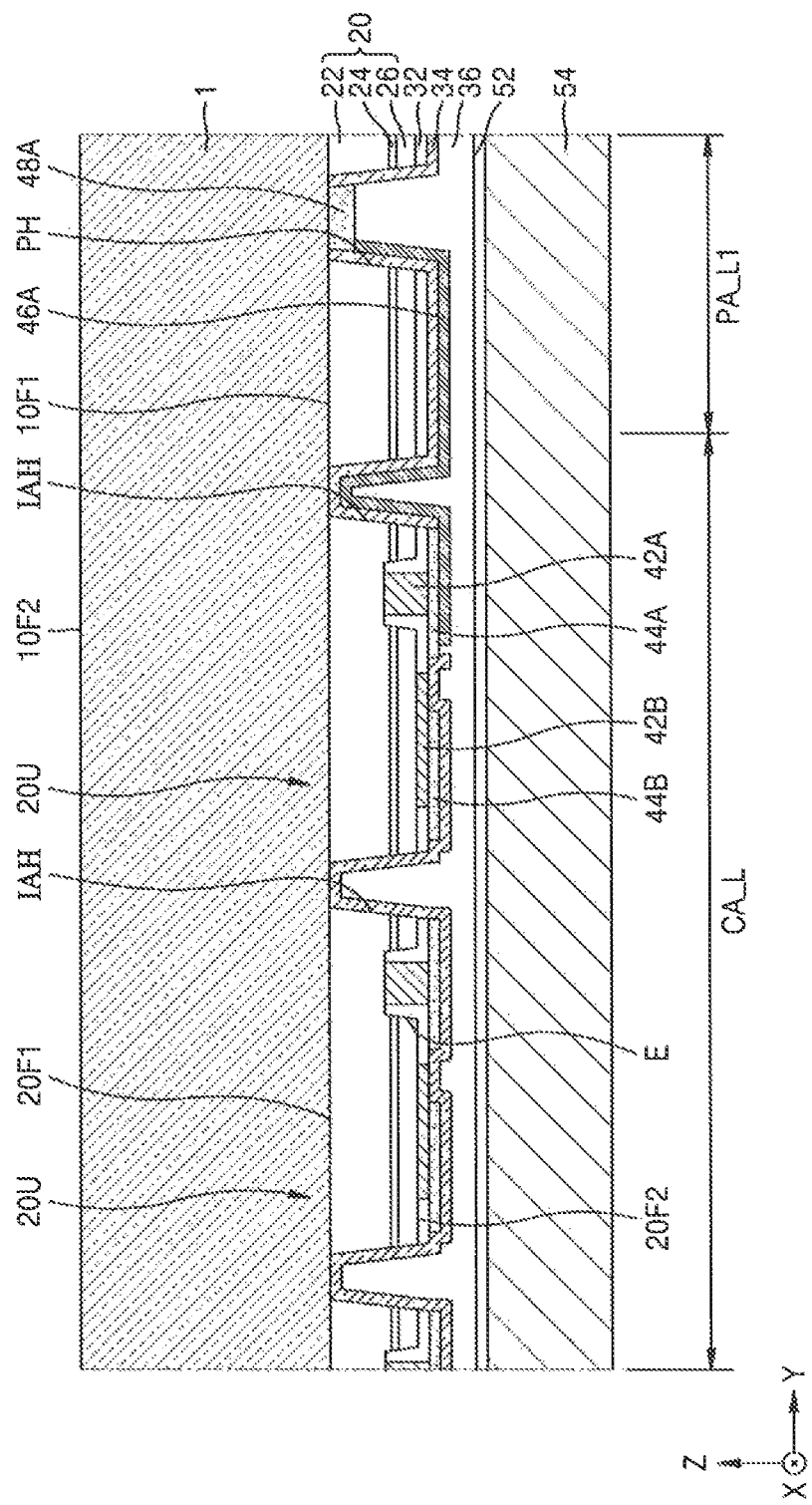

Referring to FIG. 9G, a buried insulating layer 36 may be formed on the insulating liner 34, the first line pattern 46A, and the first pad 48A. The buried insulating layer 36 may fill the remaining space of the device isolation opening IAH and the pad opening PH.

As illustrated in FIG. 9G, the first line pattern 46A may include portions arranged on the insulating liner 34 in the device isolation opening IAH, and the buried insulating layer 36 may contact the first line pattern 46A in the device isolation opening JAIL For example, since the plurality of light emitting device structures 20U are arranged in a matrix form and the first line pattern 46A for the plurality of light emitting device structures 20U is connected to the first pad 48A arranged in the first pad region PA_L1, the first line pattern 46A may pass through the inside of the device isolation opening IAH between the insulating liner 34 and the buried insulating layer 36. However, the inventive concept is not limited thereto. According to otter exemplary embodiments of the inventive concept, a buried insulating layer filling the remaining space of the device isolation opening IAH may be formed on an insulating liner, and a first line pattern may be formed on the buried insulating layer, in other words, a buried insulating layer may also be arranged between an insulating liner and a first line pattern in the device isolation opening IAH.

Thereafter, an adhesive layer 52 may be formed on the buried insulating layer 36, and a support substrate 54 may be attached onto the adhesive layer 52.

Referring to FIG. 9F1, the light emitting stack 20 attached to the support substrate 54 may be reversed such that a second surface 101F2 opposite to the first surface 10F1 of the substrate 1 faces upward, Thereafter, a top portion of the substrate 1 may be removed from the second surface 101F2 of the substrate 1 by a grinding process and thus the level of the second surface 10F2 of the substrate 1 may be lowered.

Figure 9I:
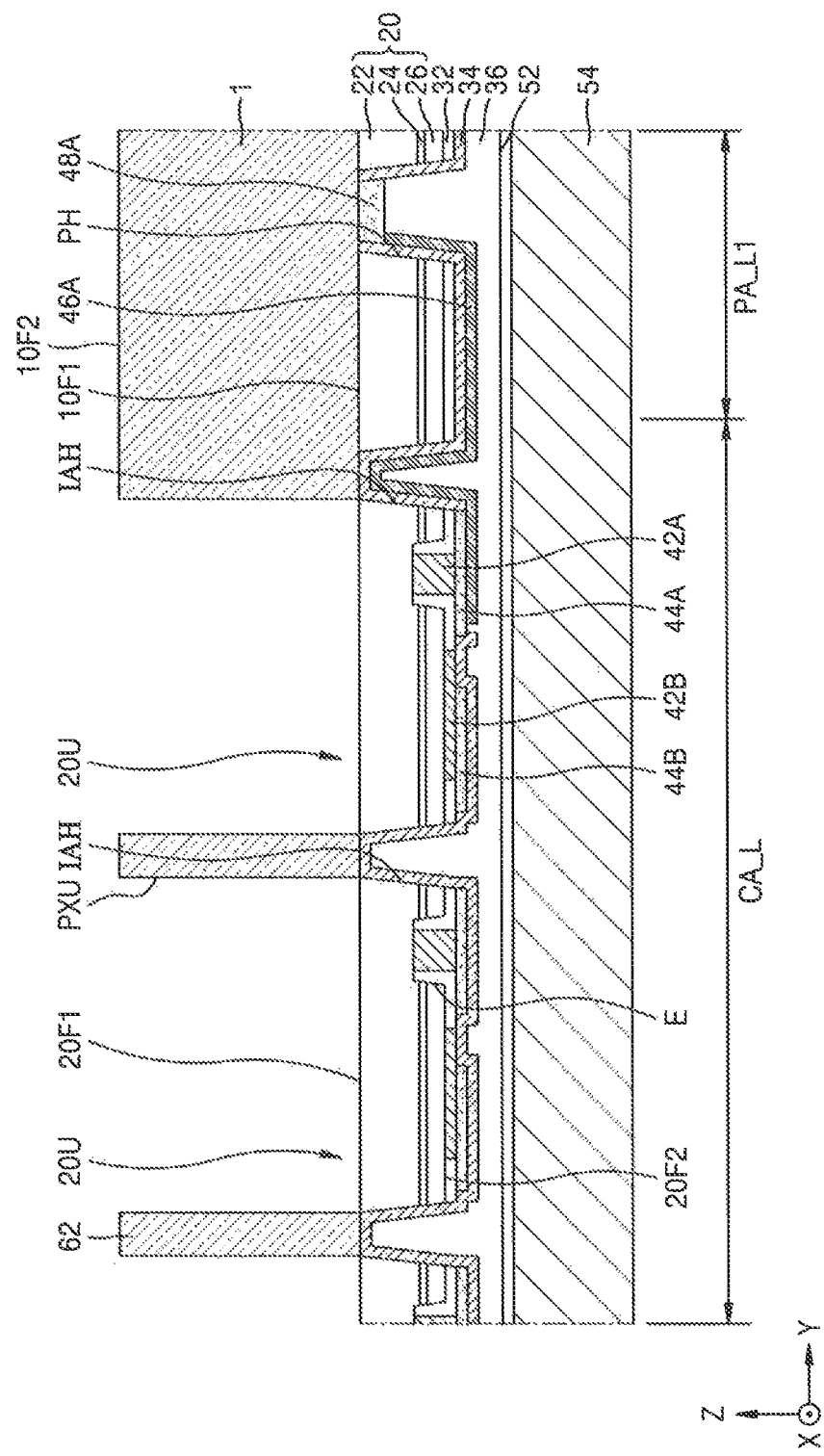

Referring to FIG. 9I, a mask pattern may be formed on the second surface 10F2 of the substrate 3, and the mask pattern may be used as an etch mask to remove a portion of the substrate 1 to form a plurality of pixel spaces PXU on the light emitting cell region CA_L. A portion of the substrate 1 arranged between the plurality of pixel spaces PXU in the light emitting cell region CA_L may be referred to as a first barrier layer 62.

The first barrier layer 62 may vertically overlap the device isolation opening IAH, and a plurality of light emitting device structures 20U may be arranged in the plurality of pixel spaces PXU, respectively. The top surface of the first conductivity type semiconductor layer 22, in other words, the first surface 20F1 of the plurality of light emitting device structures 20U, may be exposed at the bottom of the plurality of pixel spaces PXU.

In addition, in FIG. 9I, an etching process may be performed on the first conductivity type semiconductor layer 22 exposed at the bottom of the plurality of pixel spaces PXU to further form an uneven structure 20SP. In this case, the light emitting device described with reference to FIGS. 6A and 6B may be formed.

Figure 9J:
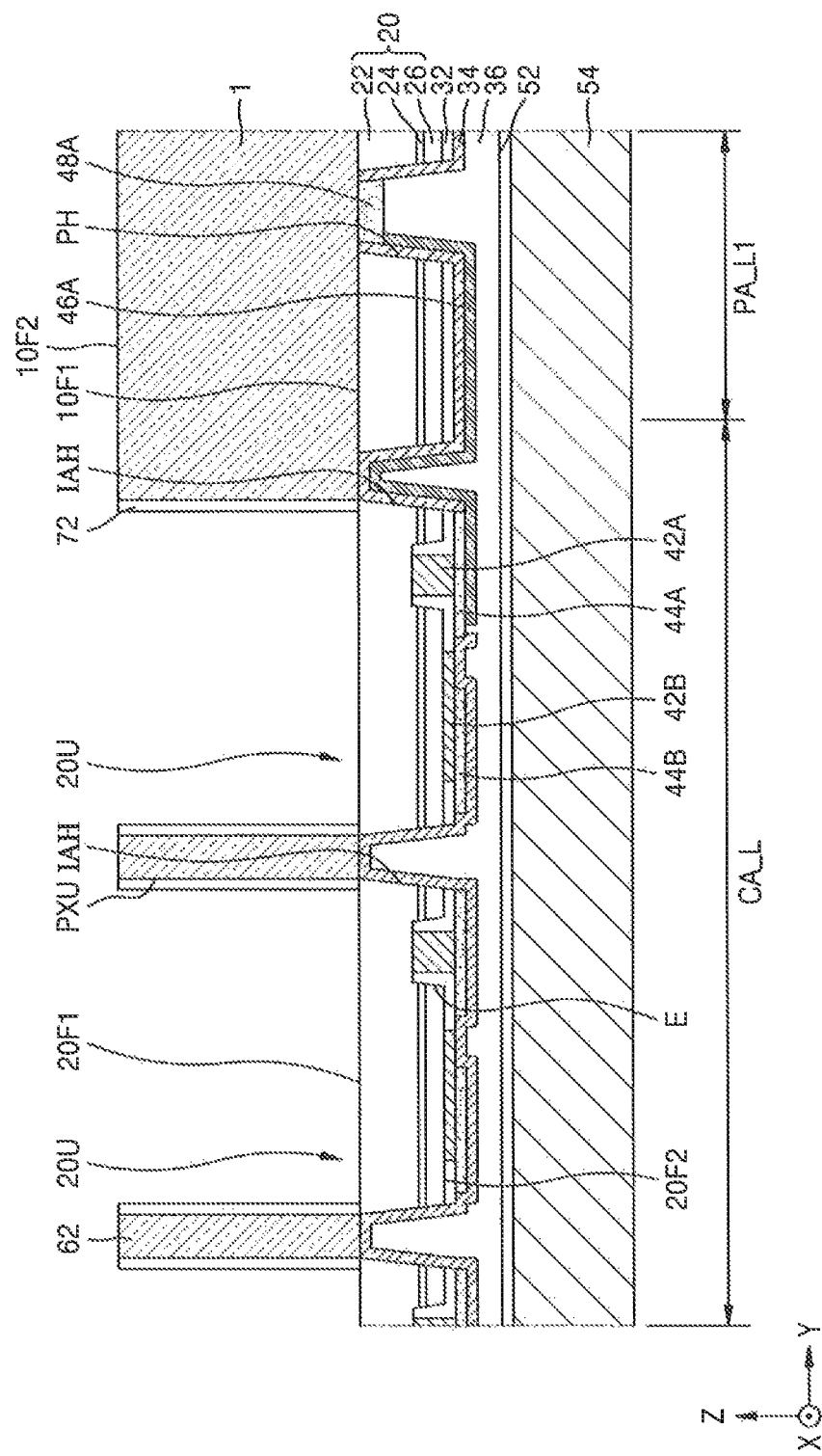

Referring to FIG. 9J, a conductive layer may be formed on the top surface of the substrate 1 and the inner wall of the plurality of pixel spaces PXU, and an anisotropic etching process may be performed on the conductive layer to form a reflective layer 72 on the side walls of the plurality of pixel spaces PXU (or the side walls of the first barrier layer 62).

Figure 9K:
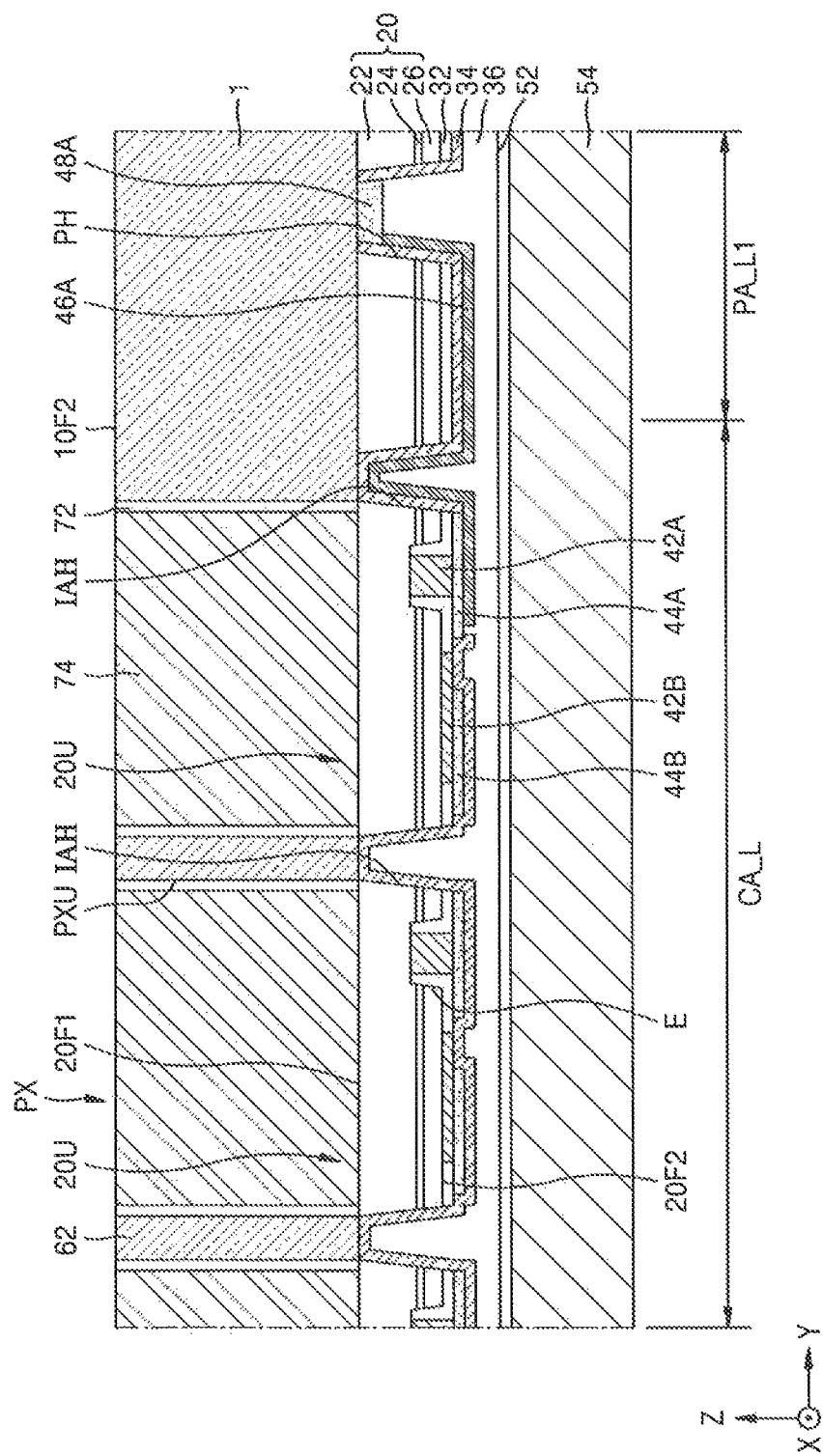

Referring to FIG. 9K, a fluorescent layer 74 may be formed to fill the plurality of pixel spaces PXU. In an exemplary embodiment of the inventive concept, the fluorescent layer 74 may be formed by applying or dispensing a resin including dispersed fluorescent particles into the plurality of pixel spaces PXU. The fluorescent layer 74 may include two or more types of fluorescent particles having different size distributions such that the fluorescent particles may be uniformly dispersed in each of the plurality of pixel spaces PXU.

Figure 9L:
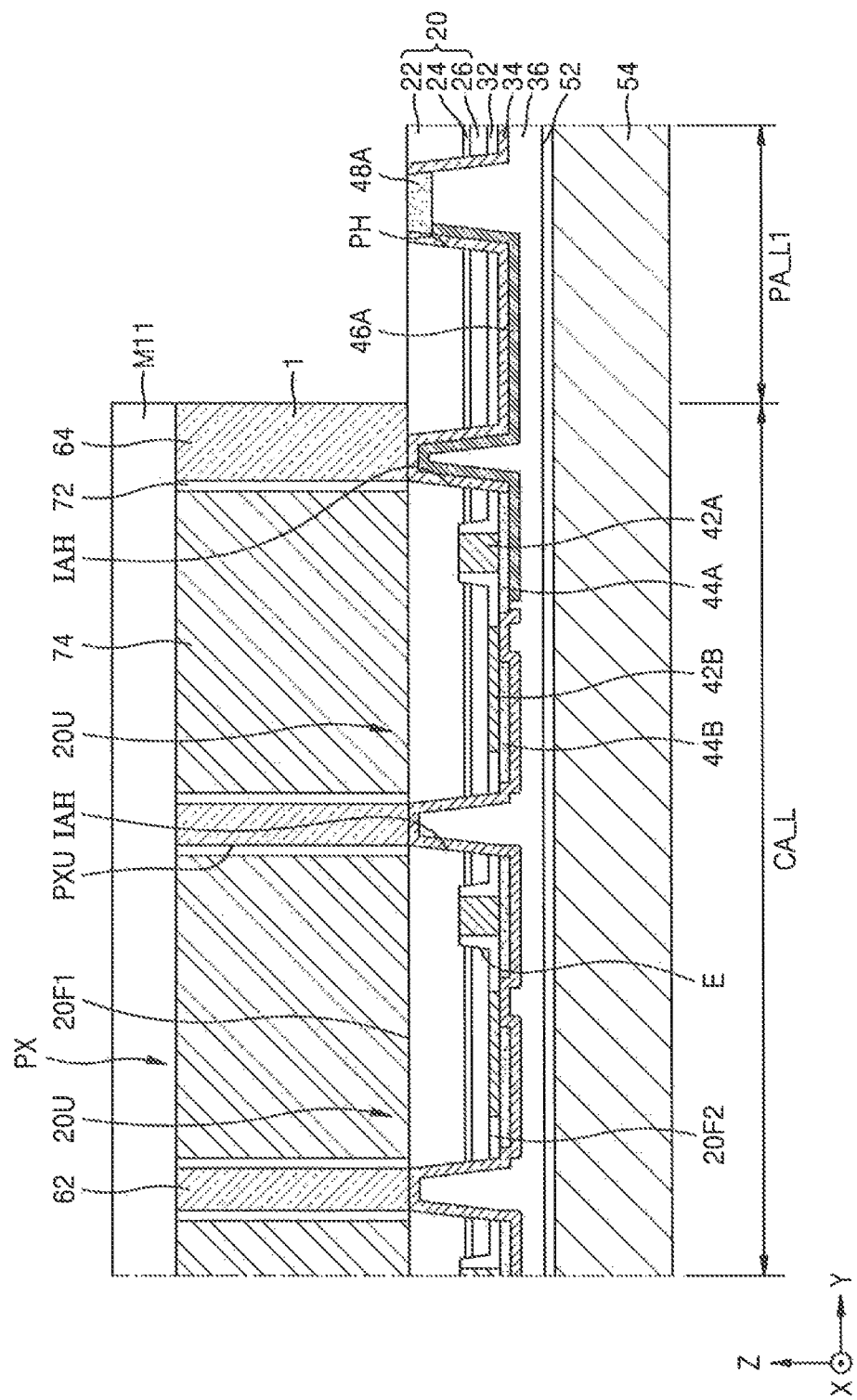

Referring to FIG. 9L, a mask pattern M11 may be formed in the light emitting cell region CA_L to cover the fluorescent layer 74 and the first barrier layer 62, and the mask pattern M11 may be used as an etch mask to remove a portion of the substrate 1 to form a second barrier layer 64.

In a plan view, the second barrier layer 64 may be arranged between the plurality of light emitting device structures 20U and the first pad region and the second barrier layer 64 may surround the first barrier layer 62. Accordingly, a barrier structure 60 including the first barrier layer 62 and the second barrier layer 64 may be formed.

Since a portion of the substrate 1 covering the first pad region PA_L1 is removed, the top surface of the light emitting stack 20 and the top surface of the first pad 48A may be exposed in the first pad region PA_L1. The top surface of the first pad 48A may be located on the same plane as the first surface 20F1 of the plurality of light emitting device structures 20U.

Thereafter, the mask pattern M11 may be removed.

By the above process, the light emitting device 100 may be completed.

In an exemplary embodiment of the inventive concept, since the plurality of light emitting device structures 20U are physically isolated from each other by the insulating liner 34 in the device isolation opening IAH, the light emitted from each of the plurality of light emitting device structures 20U may be prevented from being diffused or infiltrated into nearby or adjacent light emitting device structures 20U. In addition, since the barrier structure 60 vertically overlaps the device isolation opening IAH, the light emitted from each of the plurality of light emitting device structures 20U may be prevented from being mixed with the light emitted from nearby or adjacent light emitting device structures 20U. Thus, the contrast characteristics of the plurality of light emitting device structures 20U arranged in a matrix from may be increased.

In addition, since the width of the second barrier layer 64 is larger than the width of the first barrier layer 62, structural stability of the light emitting device 10 may be ensured in its use environment or in a process of manufacturing a fluorescent substance to form the fluorescent layer 74.

Figure 10:
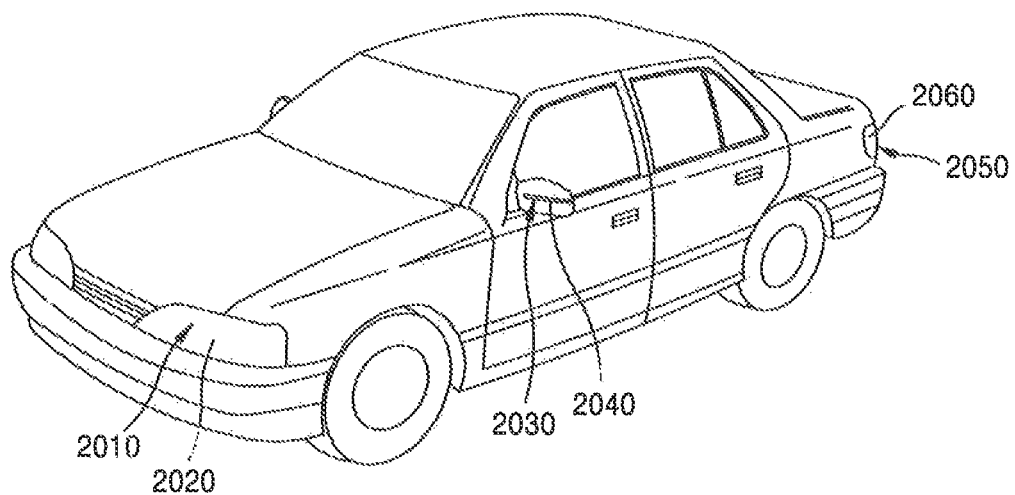
FIG. 10 is a perspective view illustrating an illumination apparatus according to an exemplary embodiment of the inventive concept.

FIG. 10 is a perspective view illustrating an illumination apparatus 2000 according to an exemplary embodiment of the inventive concept.

Referring to FIG. 10, a head lamp module 2020 may be installed in a head lamp unit 2010 of an automobile, a sideview mirror lamp module 2040 may be installed in an external sideview mirror unit 2030 of the automobile, and a tail lamp module 2060 may be installed in a tail lamp unit 2050 of the automobile. At least one of the head lamp module 2020, the sideview mirror lamp module 2040, and the tail lamp module 2060 may be implemented as one of the light source modules 10 according to the embodiments of the inventive concept described above.

Figure 11:
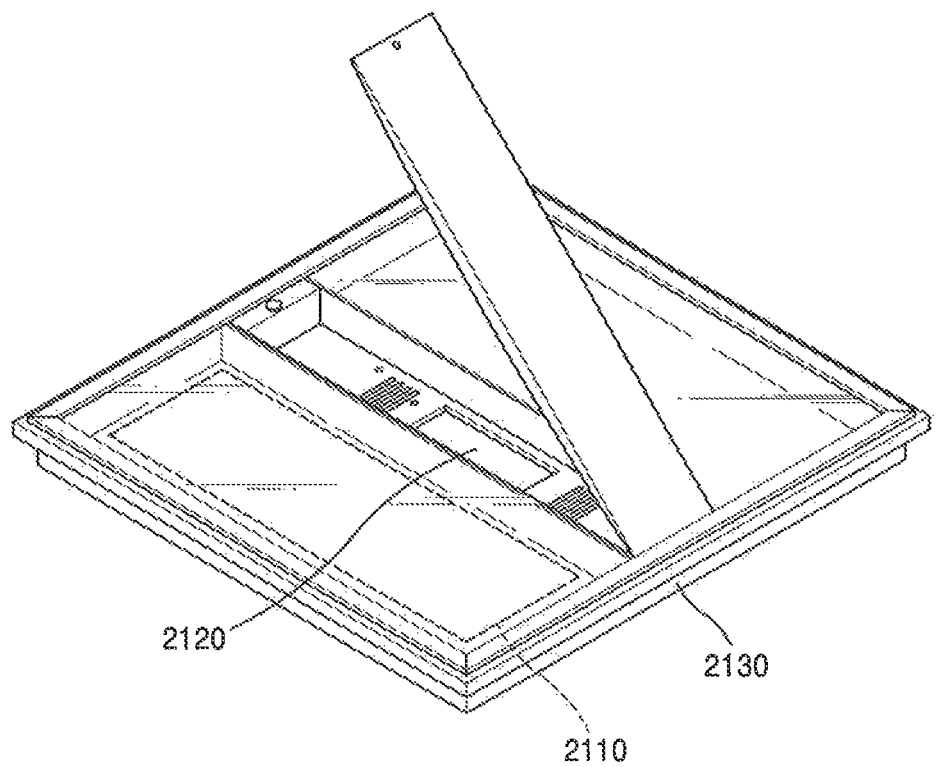
FIG. 11 is a perspective view illustrating a that panel illumination apparatus according to an exemplary embodiment of the inventive concept.

FIG. 11 is a perspective view illustrating a flat panel illumination apparatus according to an exemplary embodiment of the inventive concept.

Referring to FIG. 11, a flat panel illumination apparatus 2100 may include a light source module 2110, a power supply unit 2120, and a housing 2130. According to an exemplary embodiment of the. Inventive concept, the light source module 2110 may include a light emitting cell array as a light source. The light source module 2110 may be implemented as one of the light source modules 10 according to the embodiments of the inventive concept described above. The light source module 2110 may include a light emitting device including the light emitting cell array and driving chips and may have a planar shape.

The power supply unit 2120 may be configured to supply power to the light source module 2110. The housing 2130 may have a receiving space for receiving the light source module 2110 and the power supply unit 2120 and may be formed in the shape of a hexahedron with one open side, but the housing 2130 is not limited thereto. The light source module 2110 may be arranged to emit light to the open side of the housing 2130.

Figure 12:
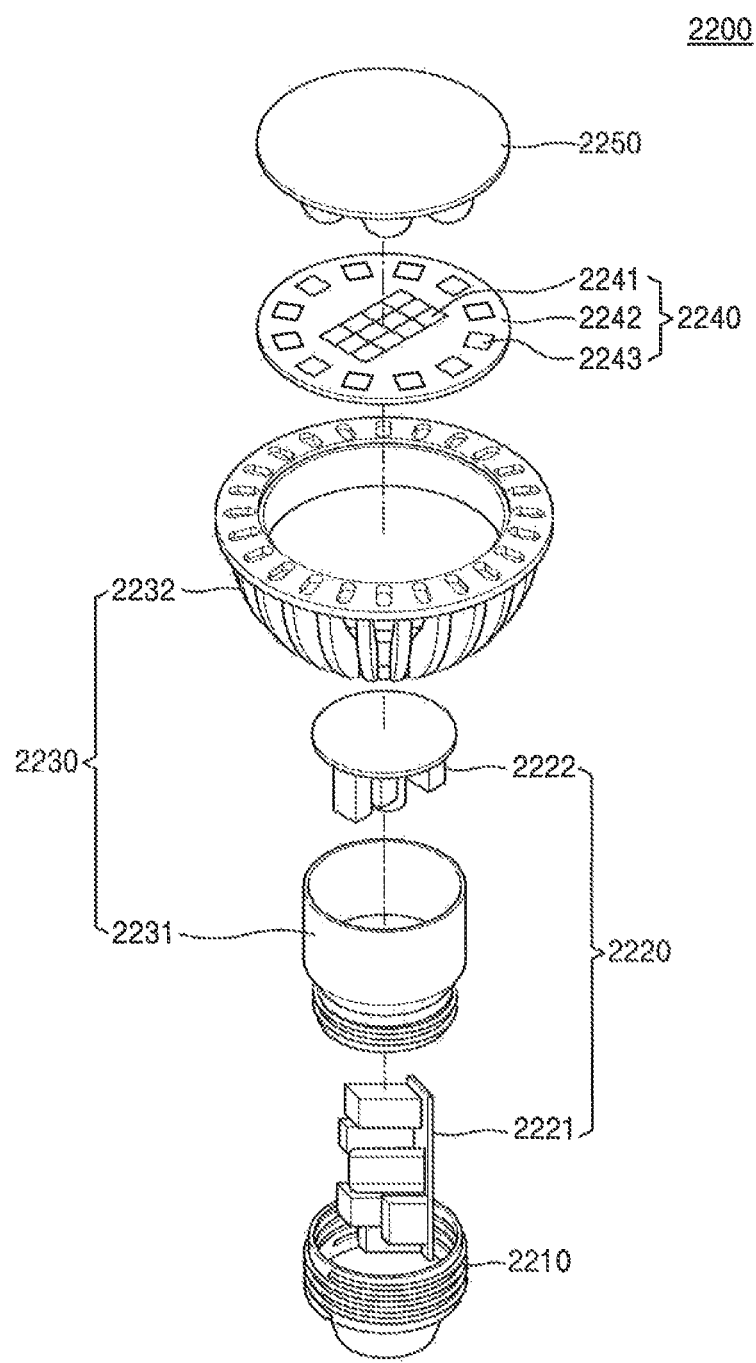
FIG. 12 is an exploded perspective view illustrating an illumination apparatus according to an exemplary embodiment of the inventive concept.

FIG. 12 is an exploded perspective view illustrating an illumination apparatus according to an exemplary embodiment of the inventive concept.

In Referring to FIG. 12, an illumination apparatus 2200 may include a socket 2210, a power supply unit 2220, a heat dissipating unit 2230, a light source module 2240, and an optical unit 2250.

The socket 2210 may be configured to be replaceable with an illumination apparatus of the related art. The power supplied to the illumination apparatus 2200 may be applied through the socket 2210. As illustrated in FIG. 12, the power supply unit 2220 may be divided into a first power supply unit 2221 and a second power supply unit 2222 that are assembled thereinto. The heat dissipating unit 2230 may include an inner heat dissipating unit 2231 and an outer heat dissipating unit 2232. The inner heat dissipating unit 2231 may be directly connected to the light source module 2240 and/or the power supply unit 2220 to transfer heat to the outer heat dissipating unit 2232. The optical unit 2250 may include an inner optical unit and an outer optical unit and may be configured to uniformly distribute the light emitted by the light source module 2240.

The light source module 2240 may receive power from the power supply unit 2220 to emit light to the optical unit 2250. The light source module 2240 may be implemented as one of the light source modules 10 according to the embodiments of the inventive concept described above.

The light source module 2240 may include a light emitting device 2241 including a plurality of light emitting cells, a circuit substrate 2242, and a plurality of driving chips 2243. Driving information of the light emitting device 2241 may be stored in the plurality of driving chips 2243.

Figure 13:
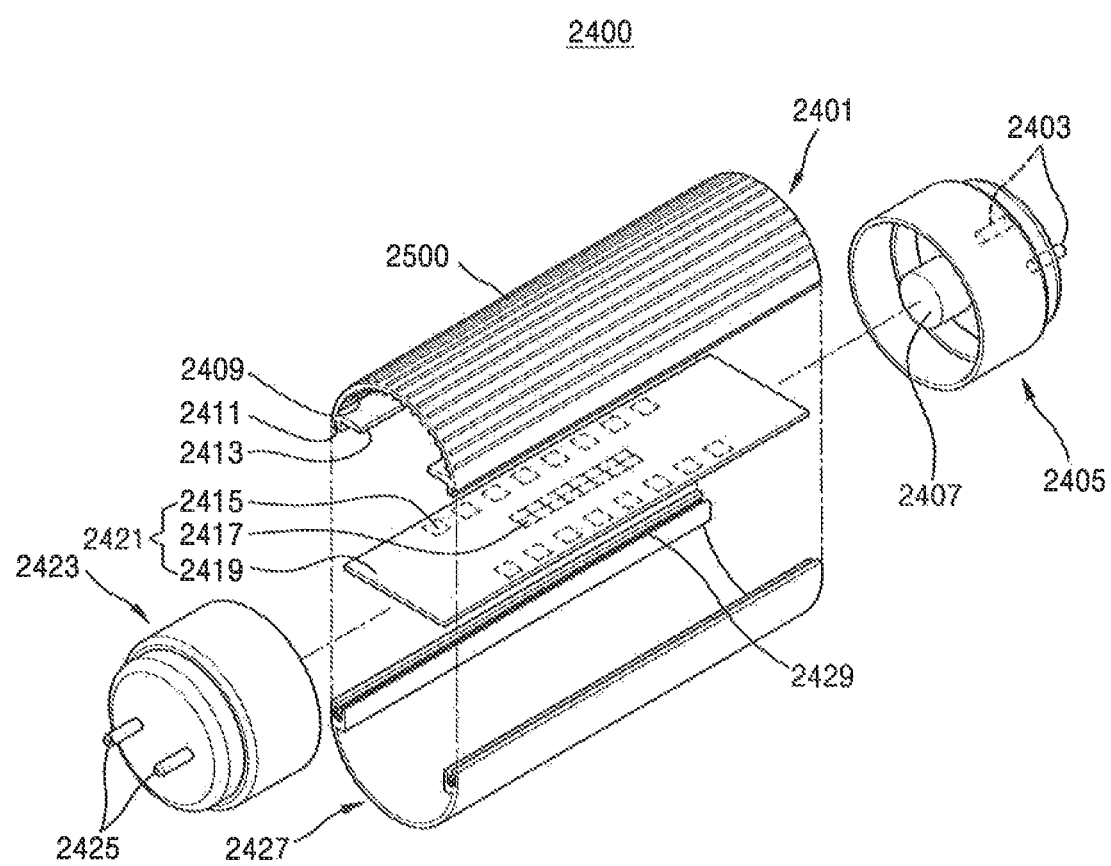
FIG. 13 is an exploded perspective view illustrating a bar-type illumination apparatus according to an exemplary embodiment of the inventive concept.

FIG. 13 is an exploded perspective view illustrating a bar-type illumination apparatus according to an exemplary embodiment of the inventive concept.

Referring to FIG. 13, an illumination apparatus 2400 may include a heat dissipating member 2401, a cover 2427, a light source module 2421, a first socket 2405, and a second socket 2423. A plurality of heat dissipating fins 2500 and 2409 may be formed in an uneven shape on the inner and/or outer surface of the heat dissipating member 2401, and the heat dissipating fins 2500 and 2409 may have various shapes and spacing. A protruding support 2413 may be formed on the inner side of the heat dissipating member 2401. The light source module 2421 may be fixed to the protruding support 2413. A locking jaw 2411 may be formed at both ends of the heat dissipating member 2401.

A locking groove 2429 may be formed at the cover 2427, and the locking jaw 2411 may be coupled to the locking groove 2429 in a hook coupling fashion. The positions of the locking groove 2429 and the locking aw 2411 may be interchanged with each other.

The light source module 2421 may be implemented as one of the light source modules 10 according to the embodiments of the inventive concept described above.

The light source module 2421 may include a light emitting cell array. The light source module 2421 may include a printed circuit board 2419, a light source 2417, and a controller 2415. The controller 2415 may be implemented as a driving chip according to an exemplary embodiment of the inventive concept described above, may store driving information of the light source 2417, and may drive the light source 2417. Circuit lines for operating the light source 2417 may be formed at the printed circuit board 2419. In addition, components for operating the light source 2417 may be included. The light source 2417 may be implemented as one of the light emitting devices 100 according to the embodiments of the inventive concept described above. Thus, the light source 2417 may include a plurality of subarrays, and the plurality of subarrays may be electrically insulated from each other.

As a pair of sockets, the first and second sockets 2405 and 2423 may have a structure that is coupled to both ends of a cylindrical cover unit including the heat dissipating member 2401 and the cover 2427. For example, the first socket 2405 may include an electrode terminal 2403 and a power supply unit 2407, and the second socket 2423 may be provided with a dummy terminal 2425. In addition, an optical sensor and/or a communication module may be embedded in any one of the first socket 2405 and the second socket 2423. For example, the optical sensor and/or the communication module may be embedded in the second socket 2423 provided with the dummy terminal 2425. As another example, the optical sensor and/or the communication module may be embedded in the first socket 2405 provided with the electrode terminal 2403.

Figure 14:
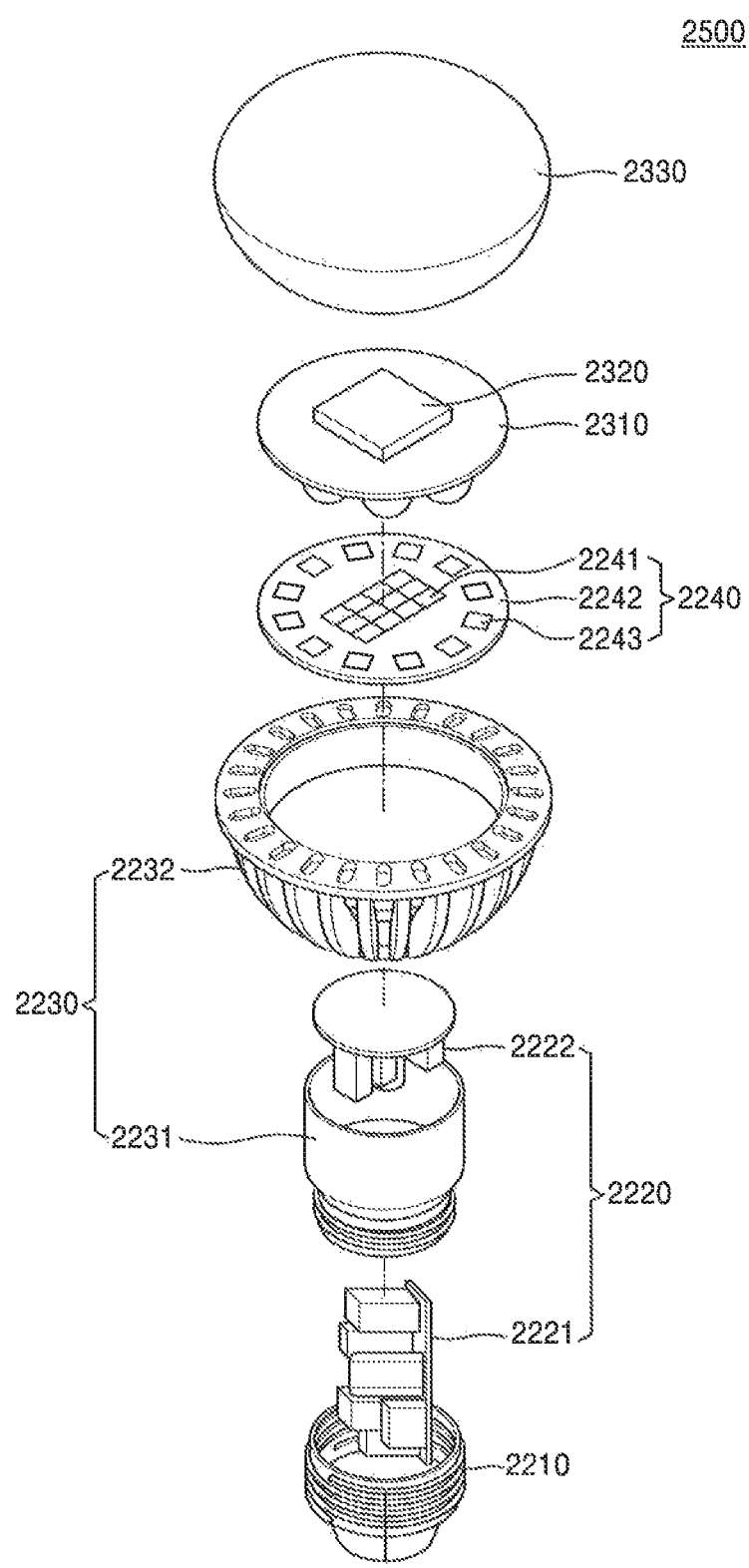
FIG. 14 is an exploded perspective view illustrating an illumination apparatus according to an exemplary embodiment of the inventive concept.

FIG. 14 is an exploded perspective view illustrating an illumination apparatus according to an exemplary embodiment of the inventive concept.

Referring to FIG. 14, unlike die illumination apparatus 2200 of FIG. 12, an illumination apparatus 2500 according to the present embodiment may include a reflective plate 2310 and a communication module 2320 ons a light source module 2240. The reflective plate 2310 may uniformly distribute the light from the light source to the side and back to reduce dazzle.

The communication module 2320 may be mounted on the reflective plate 2310, and home-network communication may be implemented through the communication module 2320, For example, the communication module 2320 may be a wireless communication module based on ZigBee, WiFi or LiFi and may control an illumination apparatus installed inside or outside a home, such as by adjusting brightness or turning on/off the illumination apparatus through a smart phone or a wireless controller. In addition, a LiFi communication module based on the visible light wavelength of the illumination apparatus installed inside or outside the home may be used to control an electronic product or an automobile system inside or outside the borne, such as a TV, a refrigerator, an air conditioner, a door lock, or an automobile. The reflective plate 2310 and the communication module 2320 may be covered by a cover unit 2330.

Figure 15:
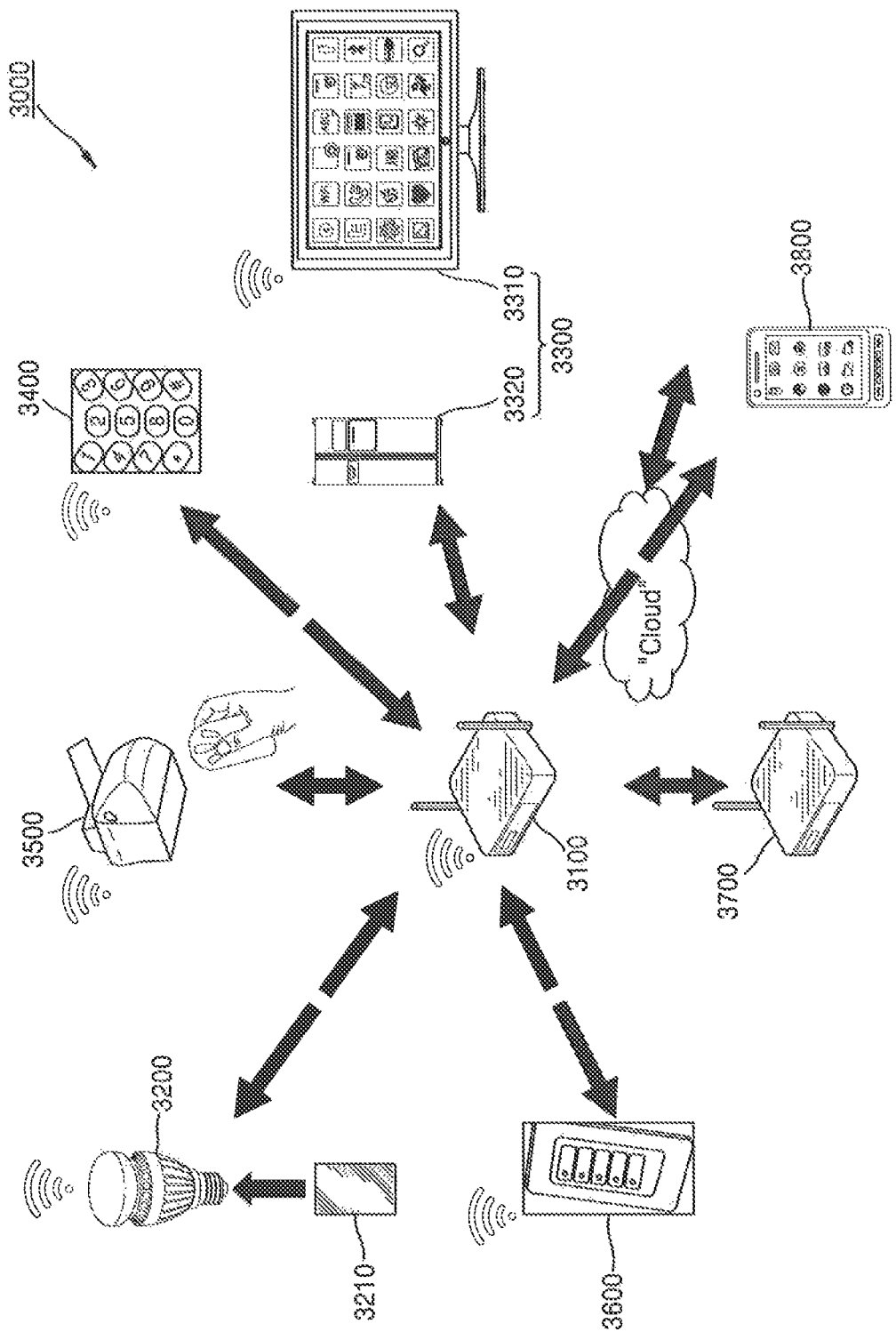
FIG. 15 is a schematic diagram illustrating an indoor illumination control network system including an illumination apparatus according to an exemplary embodiment of the inventive concept.

FIG. 15 is a schematic diagram illustrating an indoor illumination control network system including an illumination apparatus according to an exemplary embodiment of the inventive concept.

Referring to FIG. 15, a network system 3000 may be a complex smart illumination-network system in which an illumination technology based on light emitting devices such as LEDs, an Internet of things (IoT) technology, and a wireless communication technology are merged together. The network system 3000 may be implemented by using various illumination apparatuses and wired/wireless communication apparatuses, and may be realized by sensors, controllers, communication units, and/or software for network control and maintenance.

The network system 3000 may be applied not only to a closed space defined in a building such as a home or an office, but, also to an open space such as a park or a street. The network system 3000 may be implemented based on the IoT environment such that various information may be collected/processed and provided to the user.

An LED lamp 3200 included in the network system 3000 may receive information about the surrounding environment from a gateway 3100 to control the illumination of the LED lamp 3200 and may check and control the operation state of other devices 3300 to 3800 included in the IoT environment based on a visible light communication function of the LED lamp 3200. The LET) lamp 3200 may be implemented by the light emitting device 100 and the driving chips 210 constituting the light source module 10 according to the embodiments of the inventive concept described above.

The network system 3000 may include the gateway 3100 for processing data transmitted/'received according to different communication protocols, the LED lamp 3200 that is communication-connected to the gateway 3100 and includes an LED light emitting device, and a plurality of devices 3300 to 3800 that are communication-connected to the gateway 3100 according to various wireless communication methods, To implement the network system 3000 based on the IoT environment, each of the devices 3300 to 3800, including the LED lamp 3200, may include at least one communication module. In an exemplary embodiment of the inventive concept, the LED lamp 3200 may be communication-connected to the gateway 3100 by a wireless communication protocol such as WiFi, ZigBee, IAN and thus may include at least one lamp communication module 3210.

The network system 3000 may be applied not only to a closed space such as a home or an office but also to an open space such as a street or a park. When the network system 3000 is applied to a home, the plurality of devices 3300 to 3800, which are included in the network system 3000 and are communication-connected to the gateway 3100 based on the IoT technology, may include, for example, home appliances 3300 (e.g., a smart refrigerator 3320), a digital door lock 3400, a garage door lock 3500, an illumination switch 3600 installed on a wall, a router 3700 for wireless network relay, and a mobile device 3800 such as a smart phone, a tablet computer, or a laptop computer. The mobile device 3800 and the gateway 3100 may communicate via the Cloud.

In the network system 3000, the LED lamp 3200 may check the operation states of the devices 3300 to 3800 by using a wireless communication network (e.g., ZigBee. WiFi, or LiFi) installed in the home, or may automatically adjust the illuminance of the LED lamp 3200. In addition, LiFi communication based on the visible light emitted from the LED lamp 3200 may be used to control the devices 3300 to 3800 included in the network system 3000.

For example, the LED lamp 3200 may automatically adjust the illuminance of the LED lamp 3200 based on the surrounding environment information received from the gateway 3100 through the lamp communication module 3210, or the surrounding environment information collected from a sensor mourned on the LED lamp 3200. For example, the illumination brightness of the LED lamp 3200 may be automatically adjusted according to the brightness of a screen or the type of a program broadcast on a television 3310. To accomplish this, the LED lamp 3200 may receive the operation information of the television 3310 from the lamp communication module 3210 connected to the gateway 3100. The lamp communication module 3210 may be modularized as a united body with the sensor and/or the controller included in the LED lamp 3200.

For example, when a program value broadcast in a TV program is a human drama, the illumination may be lowered to a color temperature of 12000 K or less, for example, 5000 K, according to a preset value and the color may be adjusted to produce a cozy atmosphere. On the contrary, when the program value is a gag program, the network system 3000 may be configured such that the illumination is increased to a color temperature of 5000 K or more according to a setting value and is adjusted to a blue-based white illumination.

In addition, when a certain period of time has elapsed after the digital door lock 3400 is locked in the absence of a person in the home, all of the turned-on LED lamps 3200 may be turned off to prevent electricity waste. Alternatively, if a security mode is set through the mobile device 3600 or the like, when the digital door lock 3400 is locked in the absence of a person in the home, the LED lamp 3200 may be maintained in a turn-on state.

The operation of the LED lamp 3200 may be controlled according to the surrounding environment information collected through various sensors connected to the network system 3000. For example, when the network system 3000 is implemented in a building, the illumination, position sensors, and communication modules may be combined in the building, to collect the position information of persons in the building to turn on or off the illumination, or to provide the collected information in real time to enable facility management or efficient use of idle space. For example, since an illumination apparatus such as the LED lamp 3200 is arranged in almost every space of each floor in a building, various information in the building may be collected through the sensor provided integrally with the LED lamp 3200 and the collected information may be used fir facility management or utilization of idle space.

In addition, by combining the LED lamp 3200 with an image sensor, a storage device, the lamp communication module 3210, or the like, the LED lamp 3200 may be used as an apparatus that may maintain building security or detect and respond to an emergency situation. For example, when a smoke or temperature sensor is attached to the LED lamp 3200, damage may be minimized by rapidly detecting whether a tire has occurred. In addition, the brightness of the illumination may be adjusted in consideration of outside weather and/or an amount of sunshine to save energy and provide a pleasant illumination environment.

As described above, the network system 3000 may be applied not only to a closed space such as a home, an office, or a building, but also to an open space such as a street or a park. When the network system 3000 is applied to an open space having no physical limitation, there may be limitations in implementing the network system 3000 due to the distance limitation of wireless communication and the communication interference due to various obstacles. However, by mounting the sensor and the communication module on each illumination apparatus and using each illumination apparatus as an information collecting unit and a communication relay unit, the network system 3000 may be implemented more efficiently in the open environment.

Figure 16:
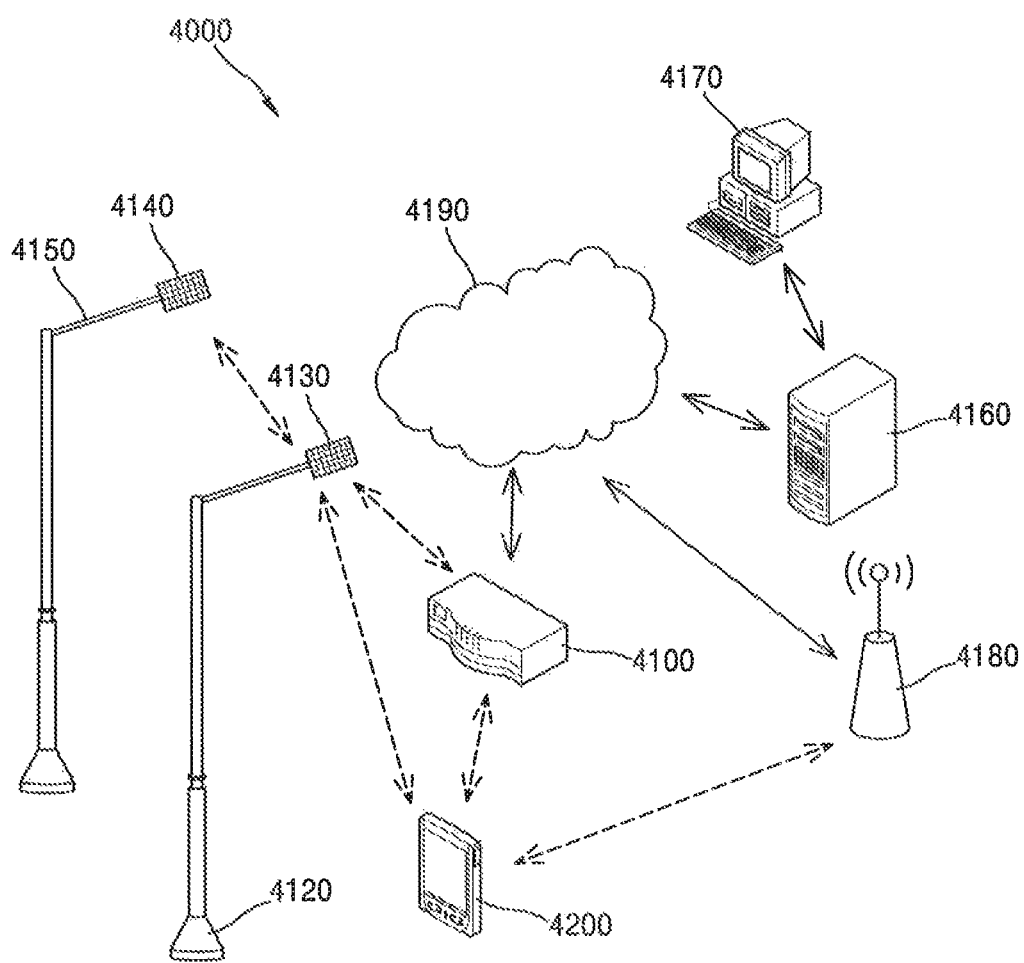
FIG. 16 is a schematic diagram illustrating a network system including an illumination apparatus according to an exemplary embodiment of the inventive concept.

FIG. 16 is a schematic diagram illustrating a network system including an illumination apparatus according to an exemplary embodiment of the inventive concept.

Particularly, FIG. 16 illustrates an embodiment of a network system 4000 applied to an open space. Referring to FIG. 16, the network system 4000 may include, for example, a communication connection device 4100, a plurality of illumination apparatuses 4120 and 4150 that are installed at certain intervals and are communication-connected to the communication connection device 4100, a server 4160, a computer 4170 for managing the server 4160, a communication base station 4180, a communication network 4190 for connecting communication equipment, and a mobile device 4200.

The plurality of illumination apparatuses 4120 and 4150 installed in an open outside space such as a street or a park may include smart engines 4130 and 4140 respectively. The smart engines 4130 and 4140 may include, for example, a light emitting device for emitting light, a driver for driving the light emitting device, a sensor for collecting information about the surrounding environment, and a communication module. The smart engine may be implemented as the light source module 10 according to the embodiments of inventive concept described above.

Through the communication module, the smart engines 4130 and 4140 may communicate with other peripheral equipment according to communication protocols such as WiFi, ZigBee, and Lifi.

As an example, one smart engine 4130 may be communication-connected to another smart engine 4140. In this case, a WiFi extension technology (e.g., a WiFi Mesh) may be applied to the communication between the smart engines 4130 and 4140. At least one smart engine 4130 may be connected by wired/wireless communication to the communication connection device 4100 connected to the communication network 4190. To increase the efficiency of communication, several smart engines 4130 and 4140 may be grouped into one group and connected to one communication connection device 4100.

As an access point (AP) capable of wired/wireless communication, the communication connection device 4100 may relay the communication between the communication network 4190 and other equipment. For example, the communication connection device 4100 may be connected to the communication network 4190 by at least one of wired/wireless methods and may be mechanically received in any one of the illumination apparatuses 4120 and 4150.

The communication connection device 4100 may be connected to the mobile device 4200 through a communication protocol such as WiFi. The user of the mobile device 4200 may receive surrounding environment information collected by the plurality of smart engines 4130 and 4140, through the communication connection device 4100 connected to the smart engine 4130 of the illumination apparatus 4120 adjacent thereto. The surrounding environment information may include surrounding traffic information, weather information, or the like. The mobile device 4200 may be connected to the communication network 4190 through the communication base station 4180 in a wireless cellular communication method such as 3G, 4G or 5G.

In addition, the server 4160 connected to the communication network 4190 may monitor the operation state of each illumination apparatus 4120 or 4150 while receiving the information collected by each smart engine 4130 or 4140 attached to each illumination apparatus 4120 or 4150. To manage each illumination apparatus 4120 or 4150 based on the monitoring result of the operation state of each illumination apparatus 4120 or 4150, the server 4160 may be connected to the computer 4170 that provides a management system. The computer 4170 may execute, for example, software that may monitor and manage the operation state of each illumination apparatus 4120 or 4150, particularly each smart engine 4130 or 4140.

Exemplary embodiments of the inventive concept provide a light emitting device that is configured to easily adjust brightness and has high light emission efficiency and a light source module that is configured to easily design a driving chip.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:
1. A light source module, comprising:
   a printed circuit board;
   a light emitting device mounted on the printed circuit board, and comprising a plurality of subarrays each of the plurality of subarrays comprising a plurality of light emitting cells separated from each other by a barrier layer; and
   at least one driving chip mounted on the printed circuit board, wherein the at least one driving chip drives the plurality of subarrays,
   wherein the plurality of subarrays are electrically isolated from each other,
   wherein the light emitting device is arranged in a central region of the printed circuit board, and
   wherein the at least one driving chip is arranged in a peripheral region of the printed circuit board at sides of the central region.

2. The light source module of claim 1, wherein the at least one driving chip comprises a plurality of driving chips, and each of the plurality of driving chips respectively drives a corresponding one of the plurality of subarrays.

3. The light source module of claim 2, wherein the plurality of driving chips corresponding respectively to the plurality of subarrays are arranged sequentially according to an arrangement order of the plurality of subarrays.

4. The light source module of claim 1, wherein the light emitting device includes a light emitting cell region arranged in a central region of the light emitting device and a pad region arranged in an peripheral region surrounding the central region of the light emitting device, and
   the plurality of light emitting cells arranged in a matrix form on the light emitting cell region.

5. The light source module of claim 4, wherein the light emitting device further comprises a plurality of pads for providing an electrical connection between the at least one driving chip and the plurality of subarrays, and the plurality of pads are arranged in the peripheral region of the light emitting device.

6. The light source module of claim 1, further comprising bonding wires electrically connecting the at least one driving chip and the plurality of pads to each other.

7. The light source module of claim 1, wherein the light emitting device is a light emitting diode (LED) chip.

8. The light source module of claim 1, further comprising an input unit for receiving a control signal from an outside source, wherein the at least one driving chip comprises a plurality of driving chips, the plurality of driving chips are electrically connected in series to each other, and one of the plurality of driving chips receives the control signal from the input unit and transmits the received control signal to another one of the plurality of driving chips.

9. The light source module of claim 1, wherein at least some of the plurality of light emitting cells included in the same subarray among the plurality of subarrays are connected in series to each other.

10. The light source module of claim 1, wherein at least some of the plurality of light emitting cells included in the same subarray among the plurality of subarrays are connected in parallel to each other.

11. A light emitting device, comprising:
a plurality of subarrays each comprising a plurality of light emitting cells separated from each other by a first barrier layer; and
a plurality of pads for providing an electrical connection between an external device and the plurality of subarrays,
wherein the plurality of subarrays are electrically isolated from each other, and
wherein the plurality of subarrays are arranged in a central region of the light emitting device.

12. The light emitting device of claim 11, further comprising a second barrier layer arranged to surround the first barrier layer, and
wherein a width of the first barrier layer is smaller than a width of the second barrier.

13. The light emitting device of claim 11, wherein the plurality of pads are arranged in a peripheral region of the light emitting device at sides of the central region.

14. The light emitting device of claim 11, wherein the plurality of subarrays are arranged in a first direction and a second direction perpendicular to the first direction, and
a larger number of the plurality of subarrays are arranged in the first direction than in the second direction.

15. The light emitting device of claim 14, wherein at least two of the subarrays sequentially arranged in the second direction are symmetrical to each other with respect to an axis parallel to the first direction.

16. The light emitting device of claim 11, wherein at least some of the plurality of light emitting cells included in at least one of the plurality of subarrays are connected in series to each other.

17. The light emitting device of claim 11, wherein at least some of the plurality of light emitting cells included in at least one of the plurality of subarrays are connected in parallel to each other.

18. The light emitting device of claim 11, wherein the plurality of pads corresponding respectively to the plurality of subarrays are arranged sequentially according to an arrangement order of the plurality of subarrays.

19. A light source module, comprising:
a printed circuit board:
a light emitting device mounted on the printed circuit board and comprising a first subarray and a second subarray, wherein the first subarray and the second subarray each comprise a plurality of light emitting cells separated from each other by a barrier layer, and
a plurality of driving chips mounted on the printed circuit board to drive the first subarray and the second subarray;
wherein the first subway and the second subarray are electrically isolated from each other,
the first subarray and the second subarray are arranged sequentially in a first direction parallel to a first surface of the printed circuit board, and
the plurality of driving chips are arranged sequentially in the first direction.

20. The light source module of claim 19, wherein the light emitting device is a light emitting diode (LED) chip.

* * * * *